United States Patent [19]

Ishigaki

[11] Patent Number: 5,659,193
[45] Date of Patent: Aug. 19, 1997

[54] SEMICONDUCTOR DEVICE AND METHOD FOR MANUFACTURING THE SAME

[75] Inventor: Yoshiyuki Ishigaki, Hyogo, Japan

[73] Assignee: Mitsubishi Denki Kabushiki Kaisha, Tokyo, Japan

[21] Appl. No.: 654,970

[22] Filed: May 28, 1996

Related U.S. Application Data

[63] Continuation of Ser. No. 339,733, Nov. 14, 1994, abandoned.

[30] Foreign Application Priority Data

Dec. 10, 1993 [JP] Japan ................... 5-310893

[51] Int. Cl.⁶ ........................... H01L 29/76
[52] U.S. Cl. ................. 257/370; 257/586; 257/622
[58] Field of Search ...................... 257/565, 586, 257/587, 607, 622, 900, 370

[56] References Cited

U.S. PATENT DOCUMENTS

| | | | |
|---|---|---|---|
| 4,902,639 | 2/1990 | Ford | 437/56 |
| 5,235,206 | 8/1993 | Desilets et al. | 257/586 |
| 5,374,846 | 12/1994 | Takemura | 257/588 |
| 5,455,448 | 10/1995 | Benjamin | 257/565 |
| 5,468,989 | 11/1995 | Nishizawa et al. | 257/517 |

FOREIGN PATENT DOCUMENTS

| | | |
|---|---|---|
| 58-155751 | 9/1983 | Japan . |
| 64-55863 | 3/1989 | Japan . |
| 2-152240 | 6/1990 | Japan . |
| 2-189964 | 7/1990 | Japan . |
| 3-73541 | 3/1991 | Japan . |
| 3-165523 | 7/1991 | Japan . |
| 3-190139 | 8/1991 | Japan . |

OTHER PUBLICATIONS

"Sub Um Bicmos Technology and its Future Trend", Hiroshi Momose, SDM89-49, pp. 1-8 Dec. 1989.

*Primary Examiner*—Mark V. Prenty
*Attorney, Agent, or Firm*—Lowe, Price, LeBlanc & Becker

[57] ABSTRACT

The present invention is provided in order to suppress a leak current at an emitter-base junction and to implement a high-speed operation of a bipolar transistor. An $n^+$ buried layer is formed at a surface of a $p^-$ silicon substrate. An $n^-$ epitaxial growth layer and an $n^+$ diffused layer are formed on $n^+$ buried layer. A $p^+$ external base region and a $p^-$ base region are formed at a surface of $n^-$ epitaxial growth layer so as to be adjacent to each other. A first interlayer insulating layer having an opening is formed on $p^-$ base region. A groove which is located under opening and extends under first interlayer insulating layer is formed at a surface of $p^-$ base region. An $n^+$ emitter region is formed at a bottom surface of groove within $p^-$ base region. A sidewall insulating layer is formed so as to expose $n^+$ emitter region and to cover a sidewall of opening and to come into contact with a bottom surface of first interlayer insulating layer.

8 Claims, 33 Drawing Sheets

SEMICONDUCTOR DEVICE AND METHOD FOR MANUFACTURING THE SAME

This application is a continuation of application Ser. No. 08/339,733 filed Nov. 14, 1994 now abandoned.

BACKGROUND OF THE INVENTION

1. Field of the Invention

The present invention relates to a semiconductor device and manufacturing method thereof, and more particularly, to a semiconductor device provided with a bipolar transistor and manufacturing method thereof.

2. Description of the Background Art

In recent years, performance of the commercial equipment such as computers has been improved remarkably. The remarkable improvement results in the requirement for a Bi-CMOS (Bipolar Complementary Metal Oxide Semiconductor) structure in which a bipolar transistor and a CMOS transistor are provided on the same semiconductor substrate. This Bi-CMOS structure can have both high performance of the bipolar transistor, and high degree of integration and low power consumption of the CMOS transistor.

The Bi-CMOS structure provided with a bipolar transistor will be described as a conventional semiconductor device.

FIG. 34 is a schematic sectional view showing a structure of the conventional semiconductor device. Referring to FIG. 34, the Bi-CMOS structure has a bipolar transistor region 520, an nMOS transistor region 40 and a pMOS transistor region 60 on the same semiconductor substrate.

In bipolar transistor region 520, an $n^+$ buried layer 3 is formed at a surface of a $p^-$ silicon substrate 1 made of silicon to which impurity is introduced. On a surface of $n^+$ buried layer 3, an $n^-$ epitaxial growth layer 5 and an $n^+$ diffused layer 7 for extracting a collector are formed.

At a surface of $n^-$ epitaxial growth layer 5, a $p^-$ base region 511 and a $p^+$ external base region 509 are formed adjacent to each other. An $n^+$ emitter region 513 is formed at a surface of $p^-$ base region 511.

A first interlayer insulating layer 73 is formed so as to cover bipolar transistor region 520. An opening 73a reaching $n^+$ emitter 513 is formed in first interlayer insulating layer 73. An emitter electrode 519 is formed so as to come into contact with $n^+$ emitter region 513 through opening 73a. Emitter electrode 519 is formed of polycrystalline silicon to which arsenic (As) has been introduced.

A second interlayer insulating layer 75 is formed on a surface of first interlayer insulating layer 73 so as to cover emitter electrode 519. A contact hole 75a reaching emitter electrode 519 is formed in second interlayer insulating layer 75. An aluminum interconnection layer 81a is formed so as to come into contact with emitter electrode 519 through contact hole 75a.

Contact holes 75b and 75c reaching $p^+$ external base region 509 and $n^+$ diffused layer 7, respectively, are formed in first and second interlayer insulating layers 73 and 75. Aluminum interconnection layers 81b and 81c are formed so as to come into contact with $p^+$ external base region 509 and $n^+$ diffused layer 7 through contact holes 75b and 75c, respectively.

Then, in nMOS transistor region 40, a $p^-$ well region 33 is formed on the surface of $p^-$ silicon substrate 1. An nMOS transistor 30 is formed at a surface of $p^-$ well region 33.

The nMOS transistor 30 has a pair of n-type source/drain regions 35, a gate oxide film 37 and a gate electrode 39.

The pair of n-type source/drain regions 35 are formed at a prescribed distance away from each other at the surface of $p^-$ well region 33. Each of n-type source/drain regions 35 has an LDD (Lightly Doped Drain) structure consisting of a relatively low concentration $n^-$ impurity region 35a and a relatively high concentration $n^+$ impurity region 35b. On a region sandwiched between the pair of n-type source/drain regions 35, a gate electrode 39 is formed with a gate oxide film 37 therebetween.

An insulating layer 41 is formed on a surface of gate electrode 39. Sidewall insulating layers 43 are formed so as to cover sidewalls of gate electrode 39.

First and second interlayer insulating layers 73 and 75 are formed so as to cover nMOS transistor 30. Contact holes 75d reaching the pair of n-type source/drain regions 35 are formed in first and second interlayer insulating layers 73 and 75. An aluminum interconnection layer 81d is formed so as to come into contact with the pair of n-type source/drain regions 35 through each of contact holes 75d.

In pMOS transistor region 60, an $n^+$ buried layer 51 is formed at the surface of $p^-$ silicon substrate 1. An $n^-$ well region 53 is formed on a surface of $n^+$ buried layer 51. A pMOS transistor 50 is formed at a surface of $n^-$ well region 53.

The pMOS transistor 50 has a pair of $p^+$ source/drain regions 55, a gate oxide film 57 and a gate electrode 59.

The pair of $p^+$ source/drain regions 55 are formed at a prescribed distance away from each other at the surface of $n^-$ well region 53. On a region sandwiched between the pair of $p^+$ source/drain regions 55, gate electrode 59 is formed with gate oxide film 57 therebetween.

An insulating layer 61 is formed on a surface of gate electrode 59. Sidewall insulating layers 63 are formed so as to cover sidewalls of gate electrode 59.

First and second interlayer insulating layers 73 and 75 are formed so as to cover pMOS transistor 50. Contact holes 75e reaching the pair of $p^+$ source/drain regions 55 are formed in first and second interlayer insulating layers 73 and 75. Aluminum interconnection layers 81e are formed so as to come into contact with $p^+$ source/drain regions 55 through contact holes 75e.

An oxide film 71 for isolating elements is provided in order to electrically isolate regions 520, 40, 60 and the like.

A method of manufacturing a conventional semiconductor device will now be described.

FIGS. 35–52 are schematic sectional views showing the method of manufacturing the conventional semiconductor device in order. First, referring to FIG. 35, a silicon oxide film 92 having a thickness in the range of 1000 to 3000 Å is formed on the whole surface of $p^-$ silicon substrate 1 by, for example, thermal oxidation. Then, silicon oxide film 92 is patterned to have a desired shape. Antimony (Sb), for example, is implanted into $p^-$ silicon substrate 1 at a dose in the range of $1.0 \times 10^{15}$ to $5.0 \times 10^{15}$ cm$^{-2}$ with about 50 keV using this patterned silicon oxide film 92 as a mask. Then, $n^+$ layers 3a and 51a are formed at the surface of $p^-$ silicon substrate 1, for example, by performing thermal processing at about 1100° C. for about two hours. Silicon oxide film 92 is then removed.

Referring to FIG. 36, $n^-$ epitaxial growth layer 5 is formed on the whole surface of $p^-$ silicon substrate 1. Thus, a structure in which $^+$ buried layers 3 and 51 are buried between $p^-$ silicon substrate 1 and $n^-$ epitaxial growth layer 5 is obtained.

Referring to FIG. 37, n-type impurity such as phosphorus (P) is implanted into $n^-$ epitaxial growth layer 5 on $n^+$ buried layer 51 at a dose of about $1.0 \times 10^{12}$ to about $5.0 \times 10^{12}$ cm$^{-2}$, and are then diffused. Thus, an n$^+$ well region 53 is formed on n$^+$ buried layer 51. In addition, p-type impurity such as boron (B) is implanted into a prescribed region of n$^-$ epitaxial growth layer 5 at a dose of about $1.0 \times 10^{12}$ to about $5.0 \times 10^{12}$ cm$^{-2}$, and are then diffused. Thus, a p$^-$ well region 33 is formed adjacent to n$^-$ well region 53.

Referring to FIG. 38, an oxide film 71 for isolating elements is formed at a prescribed region using, for example, LOCOS (Local Oxidation of Silicon).

Referring to FIG. 39, a silicon oxide film (SiO$_2$) 93 and a silicon nitride film (Si$_3$N$_4$) 94 are stacked in order on the whole surface, with an opening at a prescribed region. Then, a wafer is exposed in an atmosphere containing, for example, POCl$_3$, using silicon oxide film 93 and silicon nitride film 94 as a mask. Thus, phosphorus is diffused into n$^-$ epitaxial growth layer 5, and an n$^+$ diffused layer 7 for extracting a collector is formed. Then, silicon nitride film 94 and silicon oxide film 93 are removed successively.

Referring to FIG. 40, a thermal oxidation film 37a is formed on the whole surface by thermal oxidation. Then, polycrystalline silicon film 39a and silicon oxide film 41a both having a thickness of about 2000 Å are stacked in order by LPCVD (Low Pressure Chemical Vapor Deposition). Silicon oxide film 41a and polycrystalline silicon film 39a are patterned by photolithography and etching.

Referring to FIG. 41, gate electrodes 39 and 59 having a desired shape are formed by this patterning.

Referring to FIG. 42, a photoresist 91c is applied to the whole surface, and it is exposed and developed. Thus, a resist pattern 91c which exposes an nMOS transistor region is formed. An n-type impurity such as phosphorus is implanted at a dose of $1.0 \times 10^{13}$ to $5.0 \times 10^{13}$ cm$^{-2}$ with about 50 keV, using resist pattern 91c and gate electrode 39 as a mask. Thus, a relatively low concentration n$^-$ impurity region 35a is formed at the surface of p$^-$ well region 33. Then, resist pattern 91c is removed.

Referring to FIG. 43, after a silicon oxide film is formed so as to cover the whole surface, anisotropic etching is performed on the whole surface of the silicon oxide film. Sidewall oxide films 43 and 63 which cover sidewalls of gate electrodes 39 and 59, respectively, are formed by this anisotropic etching.

Referring to FIG. 44, a photoresist 91d is applied to the whole surface, and it is exposed and developed. Thus, a resist pattern 91d which exposes the nMOS transistor region is formed. An n-type impurity such as arsenic (As) is implanted at a dose of $1.0 \times 10^{15}$ to $5.0 \times 10^{15}$ cm$^{-2}$ with about 50 keV, using resist pattern 91d, gate electrode 39 and sidewall oxide films 43 as a mask. Thus, relatively high concentration n$^+$ impurity regions 35b are formed at the surface of p$^-$ well region 33. The n-type source/drain region 35 having the LDD structure is constituted by n$^-$ impurity region 35a and n$^+$ impurity region 35b. Thus, nMOS transistor 30 is formed. Then, resist pattern 91d is removed.

Referring to FIG. 45, a photoresist 91e is applied to the whole surface, and it is exposed and developed. Thus, a resist pattern 91e which exposes a pMOS transistor region and a prescribed region of a bipolar transistor is formed. A p-type impurity such as BF$_2$ is implanted into n$^-$ well region 53 and n$^-$ epitaxial growth layer 5 at a dose of $1.0 \times 10^{15}$ to $5.0 \times 10^{15}$ cm$^{-2}$ with about 50 keV, using resist pattern 91e as a mask. Thus, a p$^+$ source/drain region 55 is formed in the pMOS transistor region, and a p$^+$ external base region 509 is formed in the bipolar transistor region. Thus, a pMOS transistor 50 is formed. Then, resist pattern 91e is removed.

Referring to FIG. 46, a photoresist 91f is applied to the whole surface, and it is exposed and developed. Thus, a resist pattern 91f which exposes a prescribed region of the bipolar transistor region is formed. A p-type impurity such as BF$_2$ is implanted into n$^-$ epitaxial growth layer 5 at a dose of about $1.0 \times 10^{14}$ cm$^{-2}$ with about 40 keV, using resist pattern 91f as a mask. Then, thermal processing is performed at a temperature, for example, of 800° C. for about 30 minutes. Thus, a p$^-$ base region 511 adjacent to p$^+$ external base region 509 is formed with a junction depth from the surface of about 0.1 to 0.3 μm. Then, resist pattern 91f is removed.

Referring to FIG. 47, a first interlayer insulating layer 73 made, for example, of a silicon oxide film having a thickness of about 2000 Å is formed on the whole surface.

Referring to FIG. 48, after a photoresist 91g is applied to the whole surface, it is exposed and developed. Thus, a resist pattern 91g having a desired shape is formed. RIE (Reactive Ion Etching), for example, is performed on first interlayer insulating layer 73, using resist pattern 91g as a mask. Thus, an opening 73a which exposes a portion of a surface of p$^-$ base region 511 is formed in first interlayer insulating layer 73. Then, resist pattern 91g is removed.

Referring to FIG. 49, a polycrystalline silicon film 519a having a thickness of about 2000 Å is formed on the whole surface by, for example, LPCVD. Arsenic of about $5 \times 10^{15}$ cm$^{-2}$ is implanted into the whole surface of polycrystalline silicon film 519a with about 60 keV. Thermal processing is performed on polycrystalline silicon film 519a into which impurity is introduced (hereafter referred to as a doped polycrystalline silicon film) at a temperature, for example, of 800° to 850° C. for about 30 minutes.

Referring to FIG. 50, under the thermal processing, arsenic in the doped polycrystalline silicon film is diffused into p$^-$ base region 511, and an n$^+$ emitter region 513 is formed. Then, doped polycrystalline silicon film 519a is patterned and an emitter electrode 519 is formed.

Referring to FIG. 51, a second interlayer insulating layer 75 is formed on the whole surface of first interlayer insulating layer 73 so as to cover emitter electrode 519. Contact holes 75a, 75b, 75c, 75d and 75e are formed in first and second interlayer insulating layers 73 and 75 by photolithography and etching.

Referring to FIG. 52, aluminum interconnection layers 81a, 81b, 81c, 81d and 81e are formed so as to come into contact with conductive regions or the like of the lower layer through contact holes 75a, 75b, 75c, 75d and 75e, respectively.

In order to improve the degree of integration and performance of a semiconductor device according to scaling, reduction in the size of a transistor, in particular, of a gate length of a MOS transistor is required. If the gate length is reduced, distance between the source/drain regions becomes small and punch through is more likely to occur. In order to prevent punch through, diffusion of the impurity elements at the source/drain region must be suppressed. Thus, quantity of heat provided by thermal processing which is performed after the formation of a transistor must be reduced.

On the other hand, the improvement in performance of the bipolar transistor requires reduction in base width $W_B$ shown in FIG. 53. FIG. 53 is an enlarged sectional view schematically showing the bipolar transistor region of FIG. 34.

The value of cut-off frequency $f_T$ is generally used as one index of performance, in particular, of high-speed performance of the bipolar transistor. The value $f_T$ is given by the following equation:

$$f_T = \frac{1}{2\pi} \times \frac{2D_n}{W_B^2}$$

where Dn is diffusion coefficient of electrons and $W_B$ is the base width.

According to the above equation, the cut-off frequency $f_T$ is inversely proportional to the square of the base width $W_B$. Thus, if the base width $W_B$ is reduced, the value of the cut-off frequency $f_T$ is increased, resulting in the improvement in performance of the bipolar transistor.

However, if thermal processing is performed at a high temperature for a long time after the formation of the bipolar transistor, the base width $W_B$ will become large. This results from the fact that the diffusion rate of boron, i.e. impurity in the base region, is higher than that of arsenic, i.e. impurity in the emitter region. That is, the base region extends widely, while the emitter region extends not as much as the base region, resulting in the large base width $W_B$.

Thus, reduction in quantity of heat provided by thermal processing is necessary also for the improvement in performance of the bipolar transistor.

In the conventional semiconductor device, crystal defects are introduced, when the base region 511 is formed by implantation of $BF_2$ ions shown in FIG. 46.

FIG. 54 is a schematic sectional view showing how the crystal defects are introduced by implantation of $BF_2$ ions. Referring to FIG. 54, ion implantation is a technique of physically implanting ions into a substrate. Thus, implanted ions collide with atoms of crystal in the substrate and a number of crystal defects 95 are produced.

Crystal defects 95 can be repaired by thermal processing at a high temperature of 900° C. or more after the base region is formed. However, such a thermal processing at a high temperature causes punch through in the MOS transistor and degradation of performance in the bipolar transistor.

If thermal processing is performed at the temperature of at most about 850° C. after ion implantation to the base so as to reduce quantity of heat provided by the thermal processing at a high temperature, crystal defects 95 produced by the ion implantation will not be repaired.

FIG. 55 is a schematic sectional view showing the state where defects are distributed in the base region. Referring to FIG. 55, if $n^+$ emitter region 513 is formed containing crystal defects 95, crystal defects 95 will be distributed near the junction of $n^+$ emitter region 513 and $p^-$ base region 511. There is produced a depletion layer in the junction, and if crystal defects 95 are distributed in the depletion layer, current will leak from crystal defects 95. That is, leak current of emitter-base junction will increase.

FIG. 56 is a graph showing characteristics of the bipolar transistor, which is referred to as Gummel Plot. In this graph, the ordinate indicates base current $I_B$ (current extracted from a base electrode) and collector current $I_C$ (current extracted from a collector electrode), and the abscissa indicates voltage VBE applied to the base-emitter junction.

Referring to FIG. 56, if the leak current of the emitter-base junction increases, leak current of the base current $I_B$ will increase on lower voltage side (lower values of $V_{BE}$). Increase in the value of the base current $I_B$ for the lower voltages will cause significant decrease in current amplification efficiency $h_{FE}$ ($=I_I/I_B$) for lower values of the collector current $I_C$, as shown by the dotted line in FIG. 57.

That is, a prescribed current amplification efficiency $h_{FE}$ can be obtained only when a high voltage is applied to the base-emitter junction. Thus, in order to obtain the prescribed current amplification efficiency $h_{FE}$, time to increase the voltage applied to the base-emitter junction to a high value is necessary, and operation speed will be delayed correspondingly. Thus, if the leak current at the emitter-base junction increases, the operation speed of the bipolar transistor, in which high-speed operation is required, becomes slower.

SUMMARY OF THE INVENTION

It is an object of the present invention to suppress leak current at an emitter-base junction and to achieve a high speed operation of a bipolar transistor.

A semiconductor device of the present invention is provided with a semiconductor substrate, a collector impurity region of a first conductivity type, a base impurity region of a second conductivity type, an insulating layer, an emitter impurity region of a first conductivity type, and a sidewall insulating layer. The semiconductor substrate has a main surface. The collector impurity region of the first conductivity type is formed on the main surface of the semiconductor substrate. The base impurity region of the second conductivity type is formed on the main surface of the semiconductor substrate within the collector impurity region. The insulating layer is formed on the base impurity region and has an opening reaching a portion of a surface of the base impurity region. The base impurity region has a groove at the surface of the base impurity region, which is located immediately under the opening and extends from the lower end of the opening to underside of the insulating layer. The emitter impurity region of the first conductivity type is formed at the bottom of the groove in the base impurity region. The sidewall insulating layer covers a surface of the groove which is located under the insulating layer so that a surface of the emitter impurity region is exposed.

In the semiconductor device of the present invention, a groove is formed at the surface of the base impurity region. Crystal defects are generally produced at the surface of the base impurity region by ion implantation at the time of formation of the base impurity region. However, a portion where crystal defects are contained is removed by provision of the groove. Since the emitter region is formed at the region where crystal defects are removed by the groove, few crystal defects are distributed in the depletion layer of the base-emitter junction. Thus, the leak current produced by crystal defects which are distributed in the depletion layer is suppressed.

Since the groove extends not only under the opening provided in the insulating layer but also under the insulating layer, crystal defects in the base region are extensively removed by the groove. Thus, even if the depletion layer region of the base-emitter junction extends at the time of operation of the bipolar transistor, the number of crystal defects contained in the depletion layer is kept extremely small. Thus, the generation of the leak current can further be suppressed.

Since the generation of the leak current can extremely be suppressed, the increase in the base current $I_B$ is inhibited even if the voltage $V_{BE}$ applied to the base-emitter junction is low. Thus, high current amplification efficiency $h_{FE}$ can be obtained even if the voltage $V_{BE}$ is low, resulting in the high speed operation of the bipolar transistor.

A manufacturing method of the semiconductor device of the present invention includes the following steps.

First, a collector impurity region of a first conductivity type is formed on a main surface of a semiconductor substrate. Then, a base impurity region of a second conductivity type is formed on the main surface of the semiconductor substrate within the collector impurity region. An insulating layer is formed on the base impurity region so as to have an opening reaching a portion of the surface of the base impurity region. A groove which is located under the opening and extends from the lower end of the opening to underside of the insulating layer is formed by isotropically etching the surface of the base impurity region through the opening. Then, a sidewall insulating layer which covers a surface of the groove located under the insulating layer is formed so that a portion of the surface of the base impurity region is exposed. Then, an emitter impurity region of the first conductivity type is formed at that surface of the base impurity region which is exposed from the sidewall insulating layer.

In the manufacturing process of the semiconductor device of the present invention, a semiconductor device having the above-described effects can be produced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Embodiment 1

Figure 1:
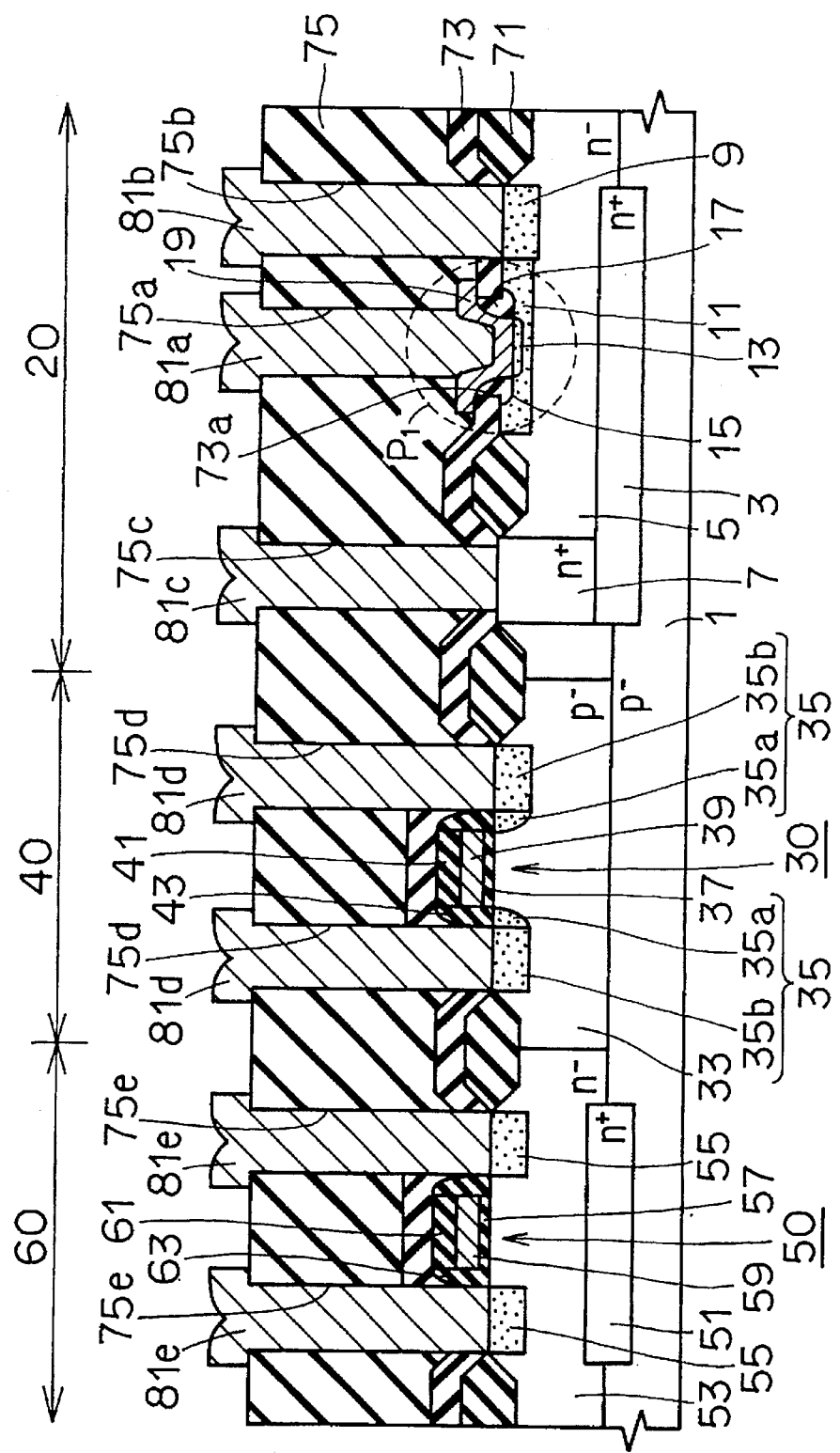
FIG. 1 is a schematic sectional view of a structure of a semiconductor device in accordance with a first embodiment of the present invention.
Figure 2:
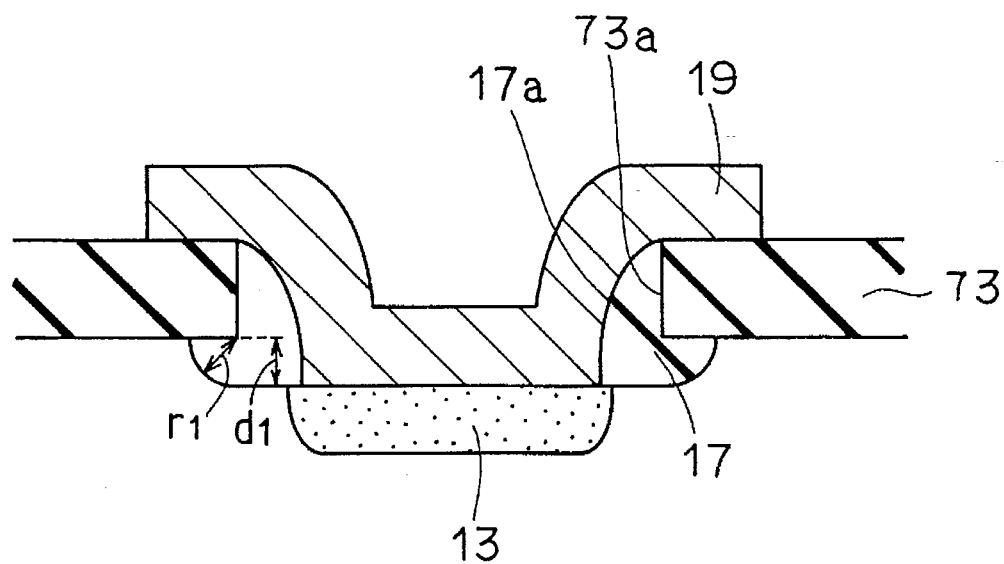
FIG. 2 is an enlarged schematic sectional view of a region $P_1$ shown in FIG. 1.

Referring to FIGS. 1 and 2, a semiconductor device in accordance with a first embodiment has a Bi-CMOS structure. The Bi-CMOS structure has a bipolar transistor region 20, an nMOS transistor region 40, and a pMOS transistor region 60 on the same semiconductor substrate. The semiconductor device of the first embodiment and a conventional semiconductor device are different from each other in the bipolar transistor region.

In bipolar transistor region 20 of the first embodiment, an n⁺ buried layer 3 is formed at a surface of a p⁻ silicon substrate 1 into which impurity is introduced. A p-type impurity is introduced into p⁻ silicon substrate 1 at a concentration in the range of $1 \times 10^{15}$ to $5 \times 10^{15}$ cm⁻³. An n-type impurity is introduced into n⁺ buried layer 3 at a concentration of about $10^{20}$ cm⁻³. An n⁻ epitaxial growth layer 5 and an n⁺ diffused layer 7 for extracting a collector are formed on a surface of n⁺ buried layer 3. An n-type impurity is introduced into n⁺ diffused layer 7 at a concentration of about $10^{20}$ cm⁻³.

A p⁻ base region 11 and a p⁺ external base region 9 are formed at a surface of n⁻ epitaxial growth layer 5 so as to be adjacent to each other. The p⁻ base region 11 is formed with a junction depth from the surface of n⁻ epitaxial growth layer 5 in the range of about 0.1 to 0.3 μm. A p-type impurity such as $BF_2$ is introduced into p⁻ base region 11 and p⁺ external base region 9 at concentrations of about $10^{-}cm^{-3}$ and about $10^{20}$ cm⁻³, respectively. An n⁺ emitter region 13 is formed at a surface of p⁻ base region 11. An n-type impurity such as arsenic is introduced into n⁺ emitter region 13 at a concentration of about $10^{20}$ cm⁻³.

A first interlayer insulating layer 73 made, for example, of a silicon oxide film having a thickness, for example, of about 2000 Å is formed so as to cover a surface of bipolar transistor region 20. First interlayer insulating layer 73 is provided with an opening 73a reaching p⁻ base region 11.

A groove 15 is formed at a surface of p⁻ base region 11 so that it is located under opening 73a and extends under first interlayer insulating layer 73. A depth $d_1$ of groove 15 is about 360 Å. A sidewall of groove 15 has such a shape that has a radius of curvature $r_1$ substantially the same as the depth $d_1$ of groove 15. Thus, the radius of curvature $r_1$ is 360 Å.

Sidewall insulating layers 17 made, for example, of a silicon oxide film or a silicon nitride film are formed so as to cover sidewalls of opening 73a and to come into contact with a bottom surface of first interlayer insulating layer 73. An n⁺ emitter region 13 is formed at a bottom surface of groove 15 in p⁻ base region 11. An n-type impurity such as arsenic is introduced into n⁺ emitter region 13 at a concentration of about $10^{20}$ cm$^{-3}$.

An emitter electrode 19 is formed on sidewall insulating layers 17 and first interlayer insulating layer 73 so as to come into contact with n⁺ emitter region 13. Emitter electrode 19 is formed of a doped polycrystalline silicon film into which arsenic has been implanted.

A second interlayer insulating layer 75 made, for example, of a silicon oxide is formed on first interlayer insulating layer 73 so as to cover emitter electrode 19. A contact hole 75a reaching emitter electrode 19 is formed in second interlayer insulating layer 75. An aluminum interconnection layer 81a is formed so as to come into contact with emitter electrode 19 through contact hole 75a.

Contact holes 75b and 75c reaching p⁺ external base region 9 and n⁺ diffused layer 7, respectively, are formed in first and second interlayer insulating layers 73 and 75. Aluminum interconnection layers 81b and 81c are formed so as to come into contact with p⁺ external base region 9 and n⁺ diffused layer 7 through contact holes 75b and 75c, respectively.

Since the structure of nMOS transistor 40 and pMOS transistor 60 is substantially the same as that of the conventional semiconductor device, description thereof will not be repeated.

An n-type or p-type impurity is introduced into an n⁺ buried layer 51, a p⁻ well region 33 and an n⁻ well region 53 so that concentrations thereof are about $10^{20}$ cm$^{-3}$, about $10^{16}$ cm$^{-3}$ and about $10^{16}$ cm$^{-3}$, respectively.

An n-type impurity is introduced into a relatively low concentration impurity region 35a and a relatively high concentration impurity region 35b so that the concentrations thereof are about $10^{17}$ to $10^{18}$ cm$^{-3}$ and about $10^{20}$ cm$^{-3}$, respectively.

A p-type impurity is introduced into a p⁺ source/drain region 55 so that a concentration thereof is about $10^{20}$ cm$^{-3}$.

A manufacturing method of the semiconductor device in accordance with the first embodiment will now be described.

Figure 48:
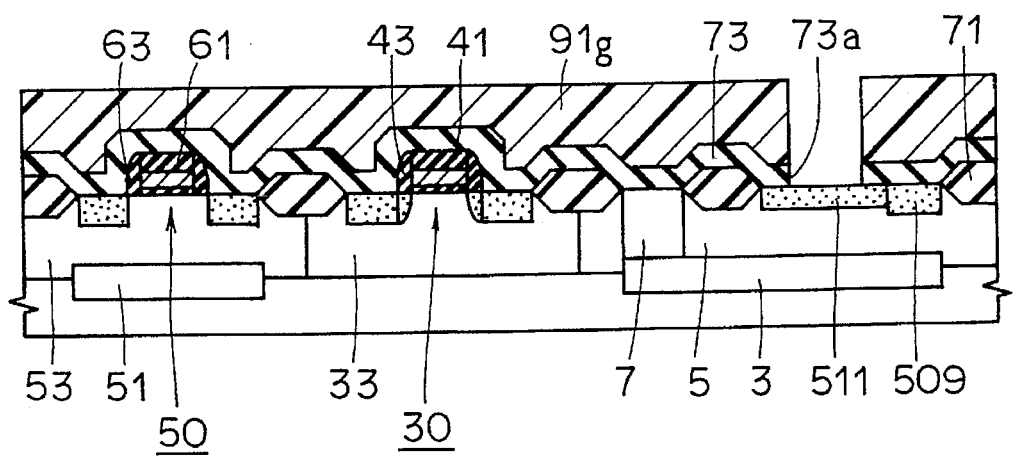
Figure 49:
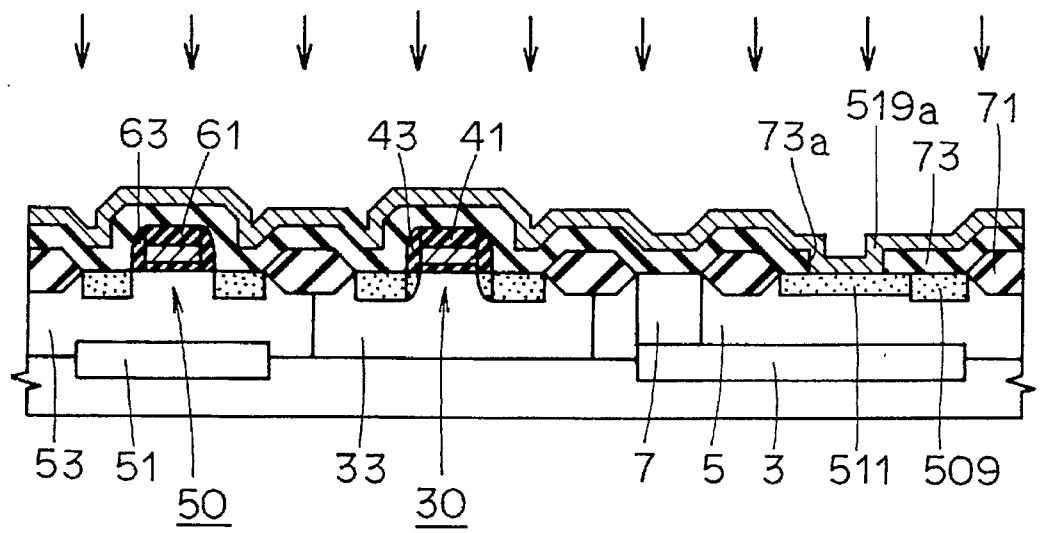
Figure 50:
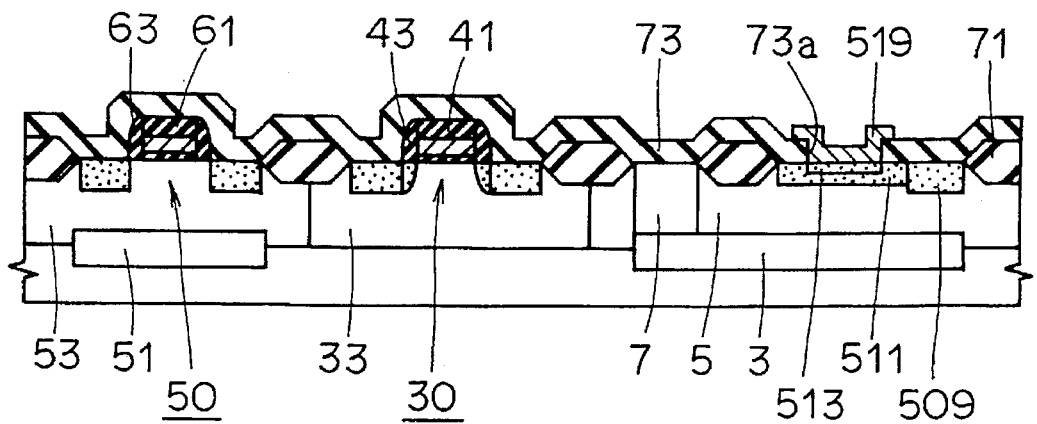
Figure 51:
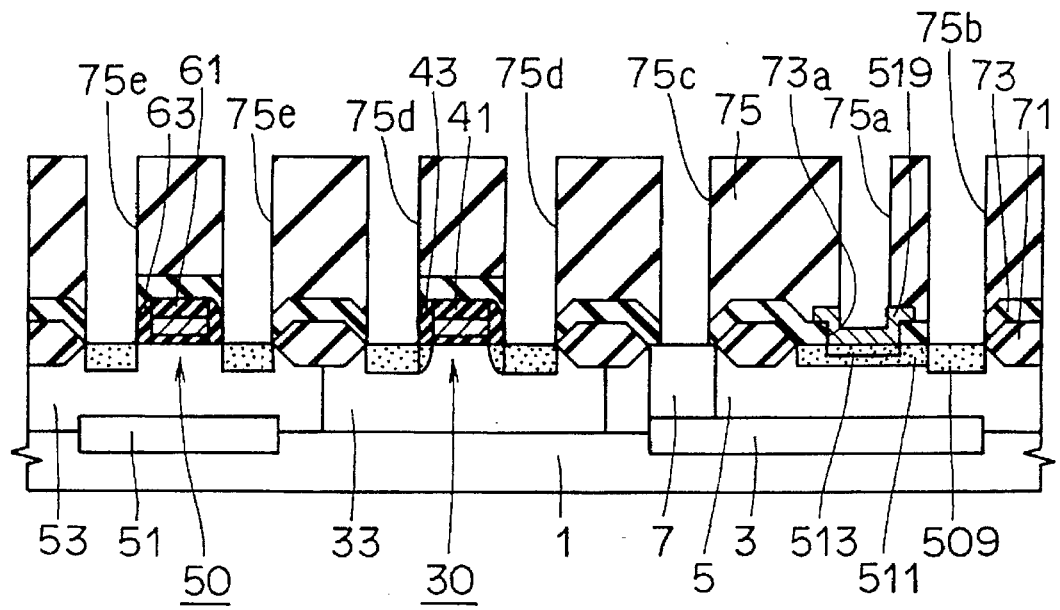
Figure 52:
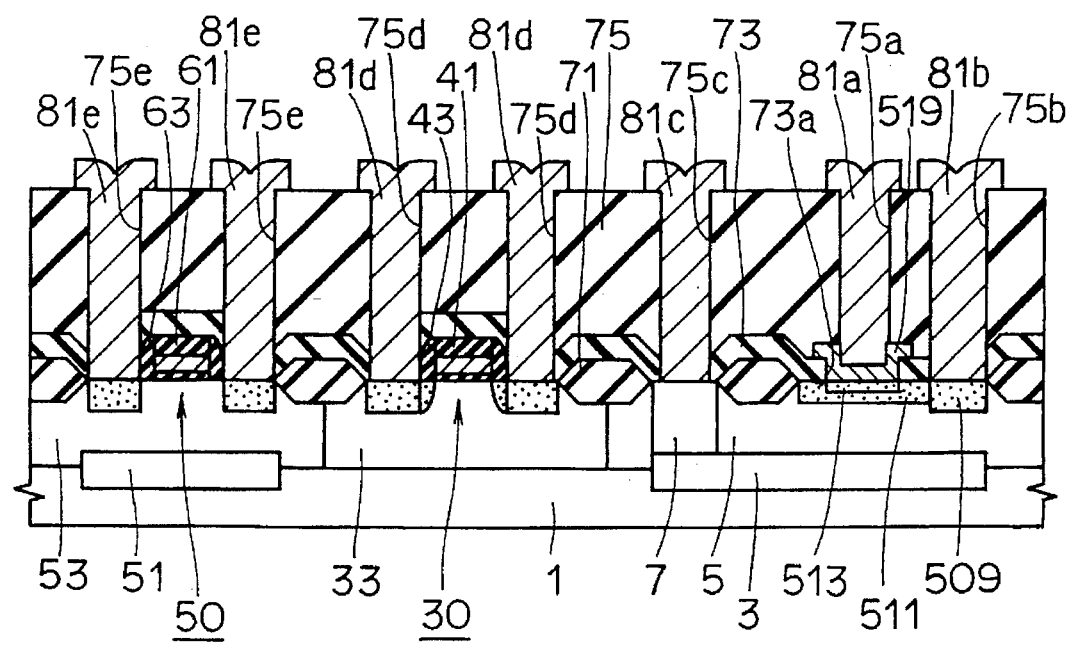
Figure 53:
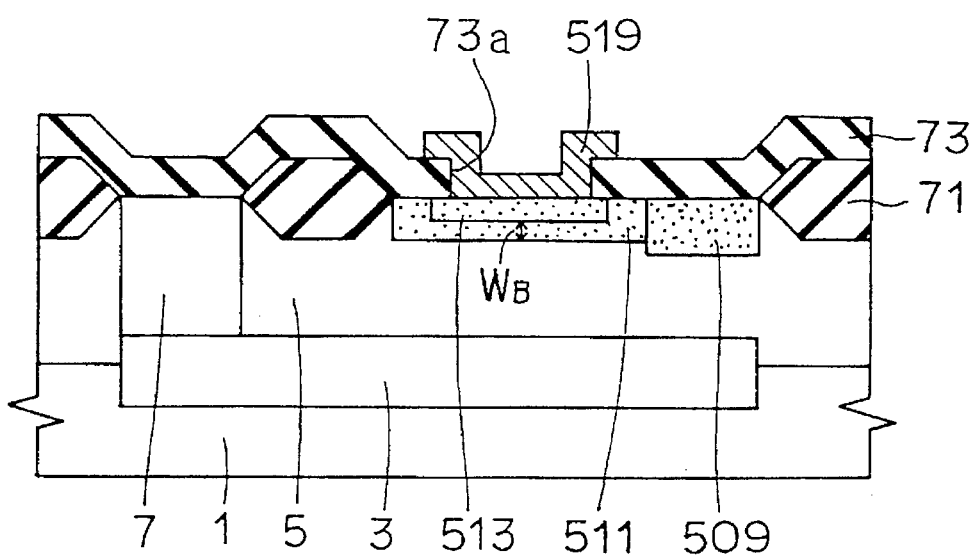
FIG. 53 is an enlarged schematic sectional view of a conventional bipolar transistor region illustrating a base width.
Figure 54:
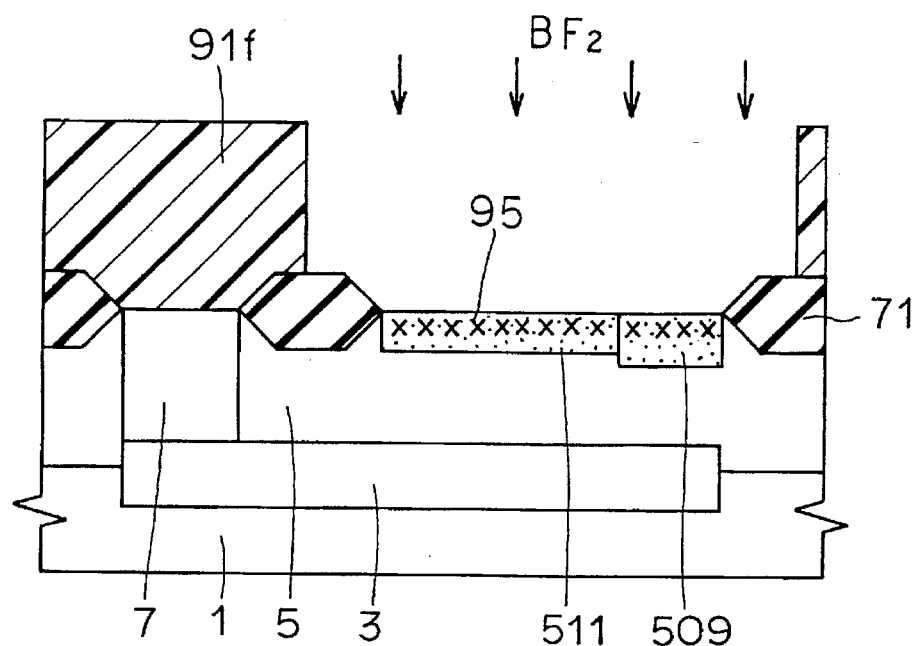
FIG. 54 is a schematic sectional view illustrating that crystal defects are produced when ions are implanted in order to form the p⁻ base region.
Figure 55:
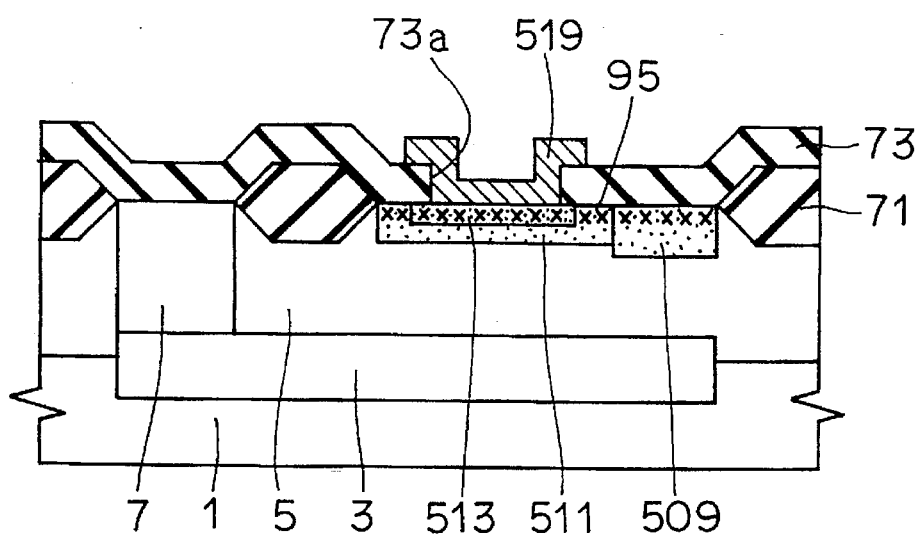
FIG. 55 is a schematic sectional view illustrating that crystal defects are distributed at a base-emitter junction.
Figure 56:
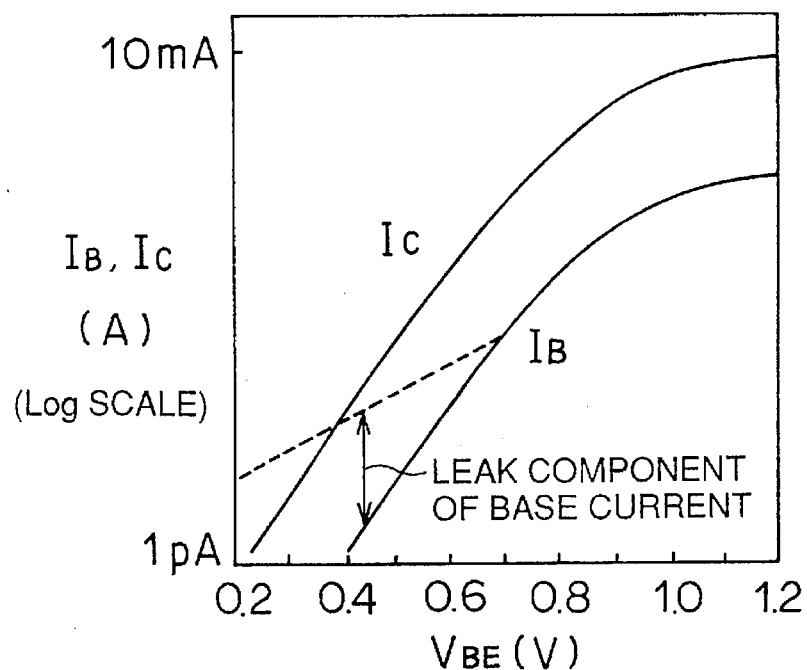
FIG. 56 is a diagram illustrating that a base current increases when a leak current is generated.
Figure 57:
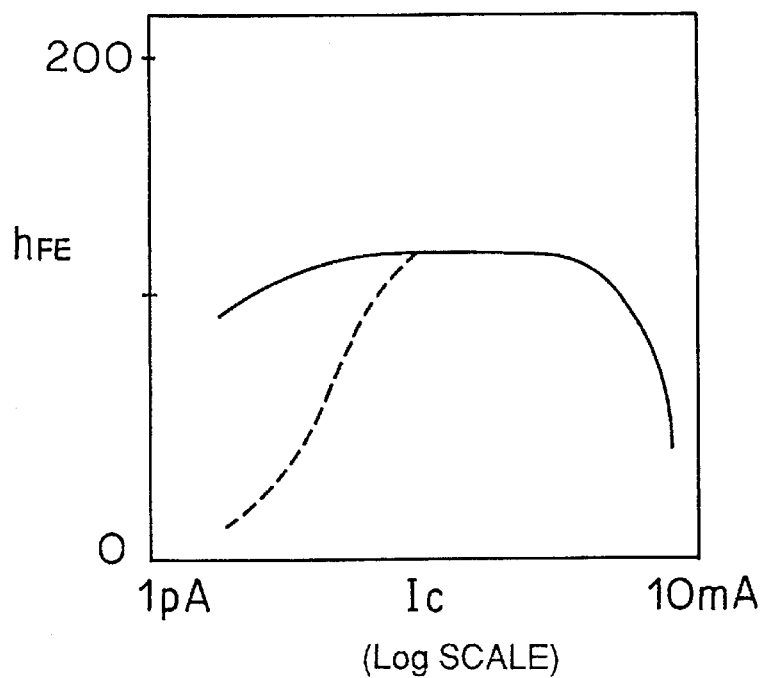
FIG. 57 is a diagram illustrating that current amplification efficiency $h_{FE}$ decreases when the leak current is generated.

The manufacturing method of the first embodiment includes the conventional steps shown in FIGS. 35–48 as initial steps. Then, referring to FIG. 48, isotropic etching is performed to a p⁻ base region 511 using a resist pattern 91g as a mask. The isotropic etching is performed using gas prepared by mixing NF$_3$ and He with partial pressures of 5 sccm and 200 sccm, respectively, with gas pressure in the chamber being set to 1 Torr and the power being set to 50 W. In this etching, an etch rate of a film to be etched (p⁻ base region) is about 5 Å/sec.

Figure 3:
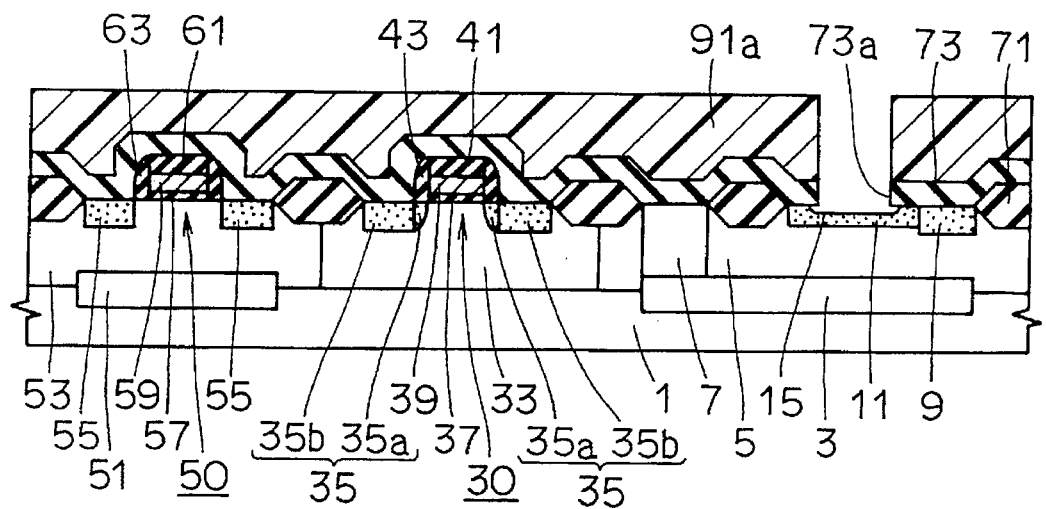
FIGS. 3–8 are schematic sectional views showing in order a manufacturing method of the semiconductor device in accordance with the first embodiment of the present invention.

Referring to FIG. 3, groove 15 having a depth of about 360 Å is formed at a surface of p⁻ base region 11 which is located under opening 73a by the isotropic etching. Groove 15 is formed so that it extends under first interlayer insulating layer 73. Then, a resist pattern 91a is removed.

Figure 4:
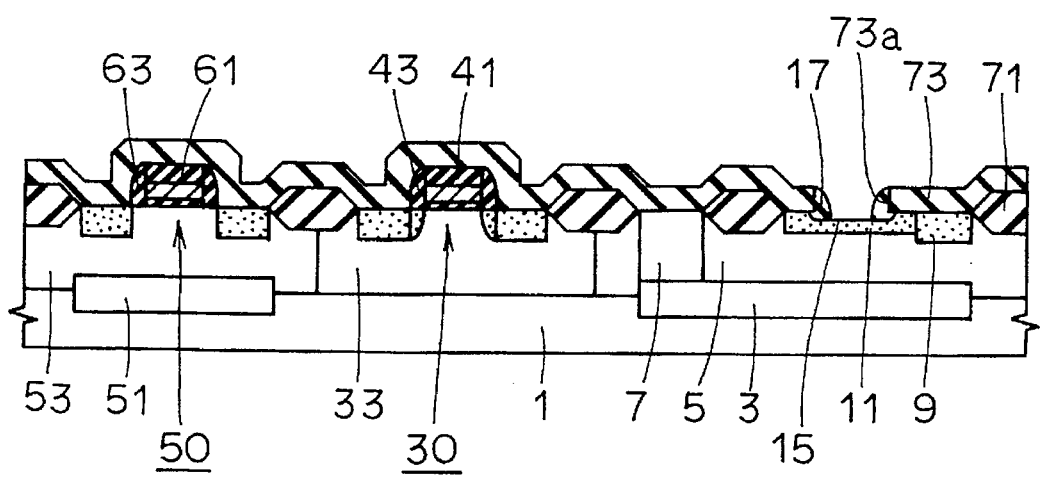

Referring to FIG. 4, an insulating layer made of, for example, a silicon oxide film having a thickness of about 2000 Å is formed on the whole surface. Anisotropic dry etching is performed to the whole surface of the insulating layer until the surface of p⁻ base region 11 is exposed. Thus, sidewall insulating layers 17 which cover the sidewalls of opening 73a and come into contact with the bottom surface of first interlayer insulating layer 73 are formed. A portion of the bottom surface of groove 15 is exposed from sidewall insulating layers 17.

Figure 5:
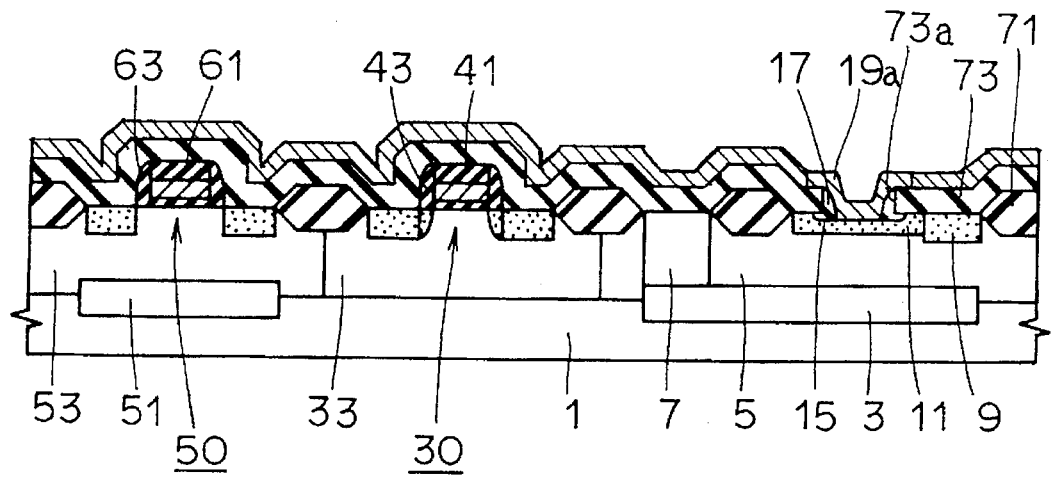

Referring to FIG. 5, a polycrystalline silicon film 19a having a thickness of about 2000 Å is formed on the whole surface, for example, by LPCVD so as to come into contact with the bottom of groove 15. Arsenic is implanted into the whole surface of polycrystalline silicon film 19a at a dose of $5.0 \times 10^{15}$ cm$^{-2}$ with about 60 keV. Then, thermal processing is performed at a temperature, for example, of 800° to 850° C. for about 30 minutes. Arsenic in polycrystalline silicon film 19a is diffused into p⁻ base region 11 by the thermal processing.

Figure 6:
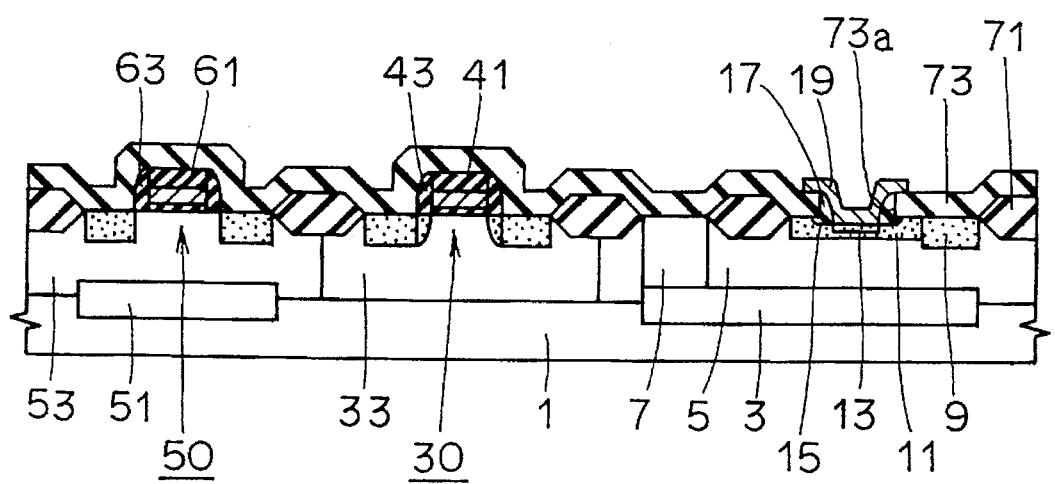

Referring to FIG. 6, n⁺ emitter region 13 is formed at the bottom of groove 15 in p⁻ base region 11 by the diffusion of impurities. Then, polycrystalline silicon film 19a is patterned with a desired shape by photolithography and etching. Thus, emitter electrode 19 made of the doped polycrystalline silicon film is formed.

Figure 7:
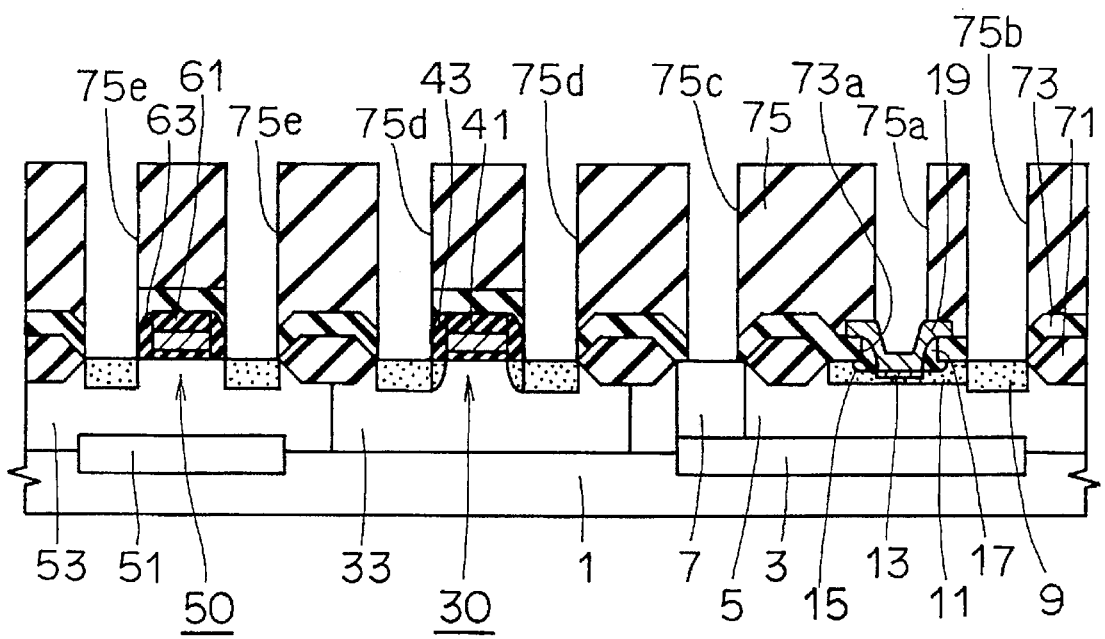

Referring to FIG. 7, second interlayer insulating layer 75 is formed on the whole surface of first interlayer insulating layer 71 so as to cover emitter electrode 19. Contact holes 75a, 75b, 75c, 75d and 75e are formed in second interlayer insulating layer 75 by photolithography and etching.

Figure 8:
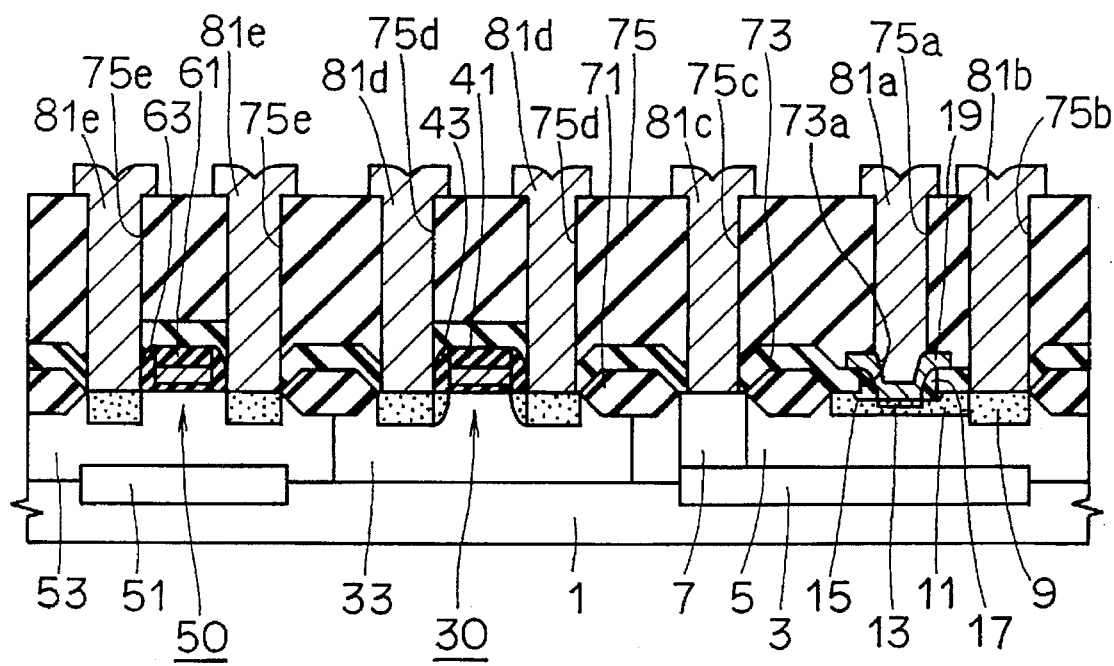

Referring to FIG. 8, aluminum interconnection layers 81a, 81b, 81c, 81d and 81e are formed so as to come into contact with conductive regions or the like of the lower layer through contact holes 75a, 75b, 75c, 75d and 75e, respectively.

Figure 9:
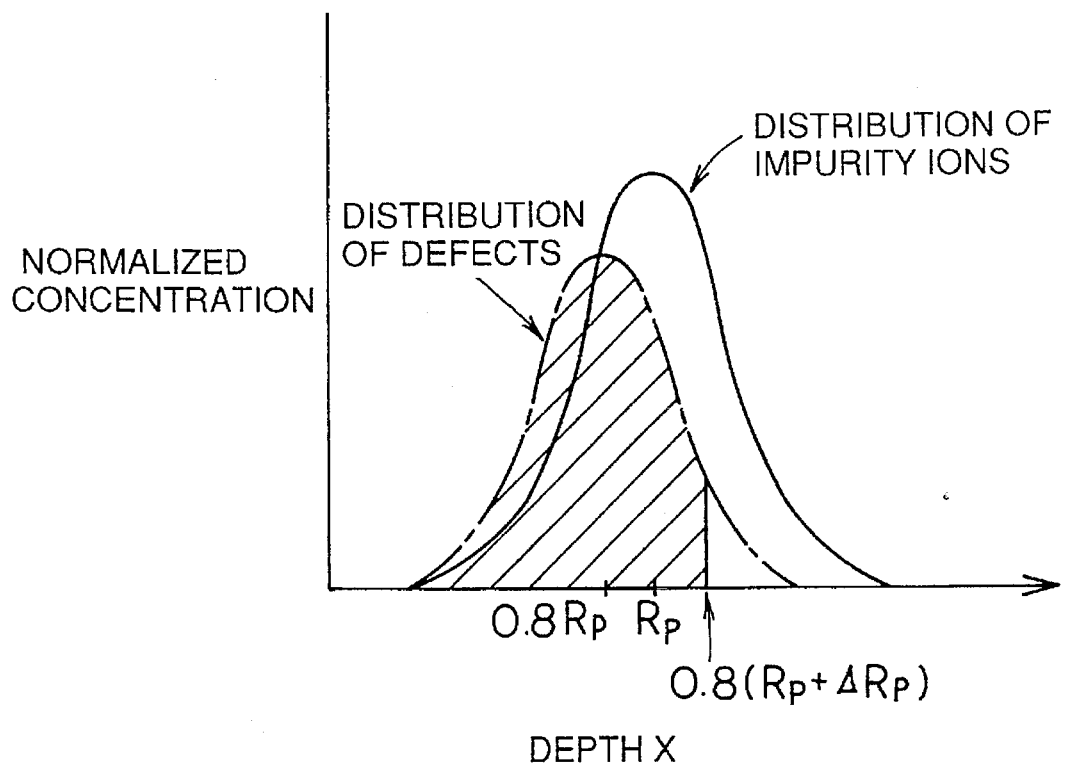
FIG. 9 is a graph showing distribution of impurity ions and crystal defects in a direction of the depth of a p⁻ base region.
Figure 46:
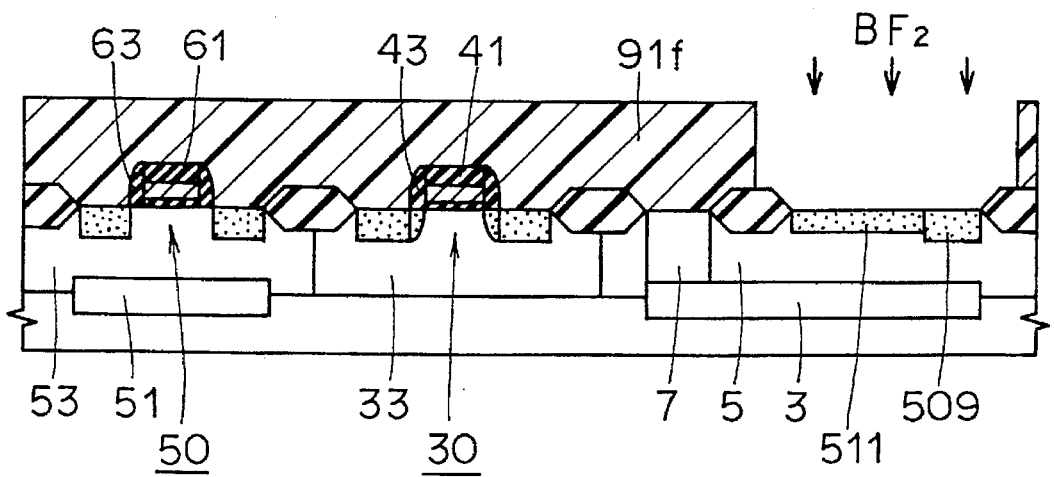
Figure 47:
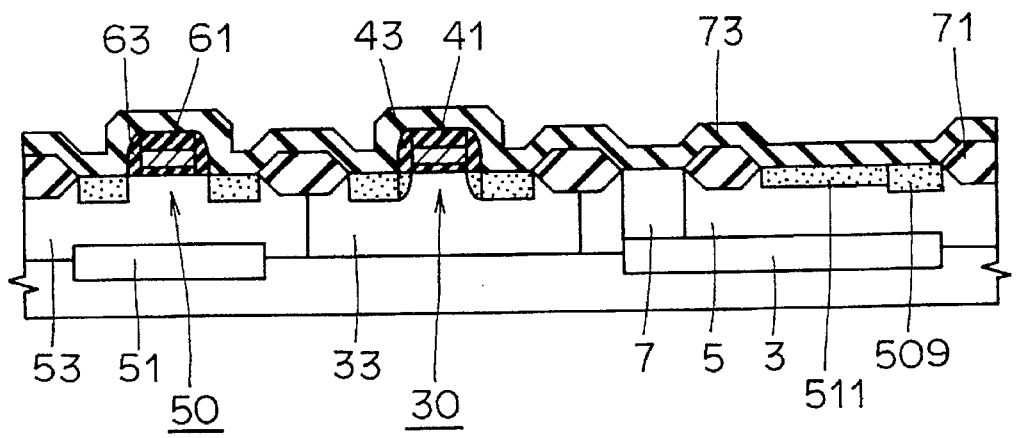

As described above, in the step of ion implantation in forming p⁻ base region 511 shown in FIG. 46, a number of crystal defects are produced near the surface of p⁻ base region 511 and p⁺ external base region 509. Distribution of the crystal defects has a peak at about 80% of degree of projected range (Rp) at the time of ion implantation. That is, referring to FIG. 9, assuming that the distribution of implanted impurity ions (solid line) is Gaussian distribution, the distribution of the crystal defects (chain line with one dot) has a peak at about 80% of degree of projected range (Rp). In FIG. 9, the ordinate indicates normalized concentration and the abscissa indicates depth X from a surface of a substrate.

Figure 10:
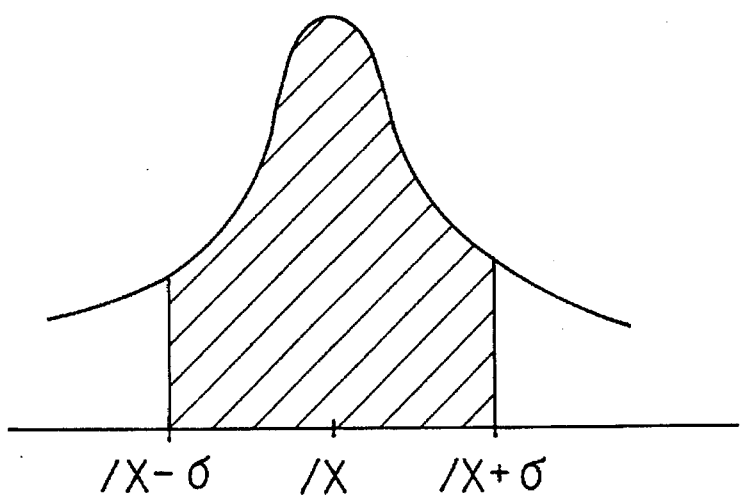
FIG. 10 is an illustration of Gaussian distribution.

In Gaussian distribution, as shown in FIG. 10, about 68% of the total is distributed in a region of /X (average) ±σ (deviation) (a shaded portion in the figure). Thus, if a groove is formed by etching to a depth of (Rp+ΔRp)×0.8, where ΔRp is a deviation of Rp, shown in FIG. 9, 84% of the total crystal defects can be eliminated.

That is, by etching to the depth of (Rp+ΔRp)×0.8, not only defects distributed in the depth of X=(Rp−ΔRp)×0.8 to (Rp+ΔRp)×0.8 but also in the range depth of X=0 to (Rp−ΔΔRp)×0.8 are eliminated. Thus, 68+(100−68)/2=84 (%) of the total defects can be eliminated.

The average is here represented by /X for convenience.

For example, if an implantation energy of BF$_2$ is 40 keV (Rp=300 Å, ΔRp=153 Å), about 80% of the crystal defects can be eliminated by etching to a depth of about 360 Å. In this case, if a bipolar transistor has an emitter area of 1×6 µm$^2$, leak component of the base current for $V_{BE}$=0.2 V can be reduced to at most 1 pA.

Since groove 15 with a prescribed depth is provided and n⁺ emitter region 13 is formed at the bottom of groove 15 as described above, leak current resulting from the distribution of the crystal defects can significantly be suppressed.

Figure 11:
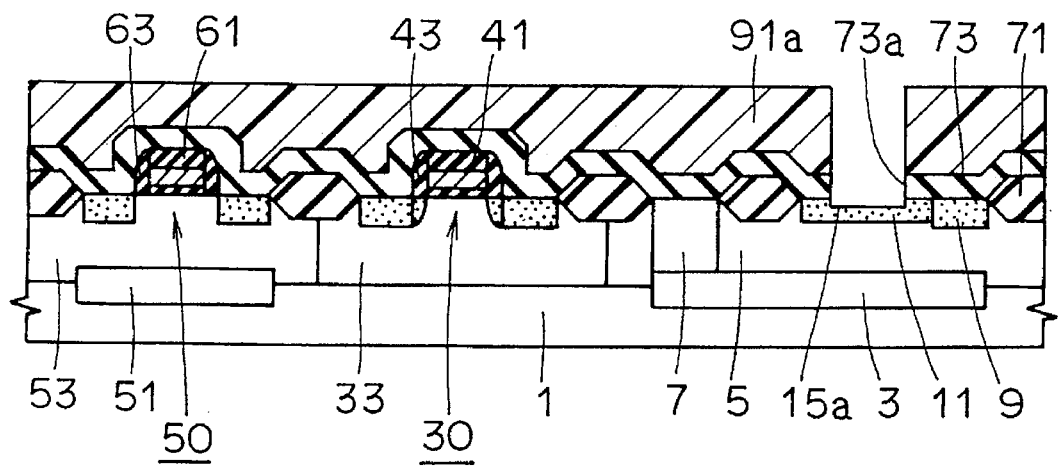
FIGS. 11–12 are schematic views showing in order the steps of forming a groove by anisotropic etching.
Figure 12:
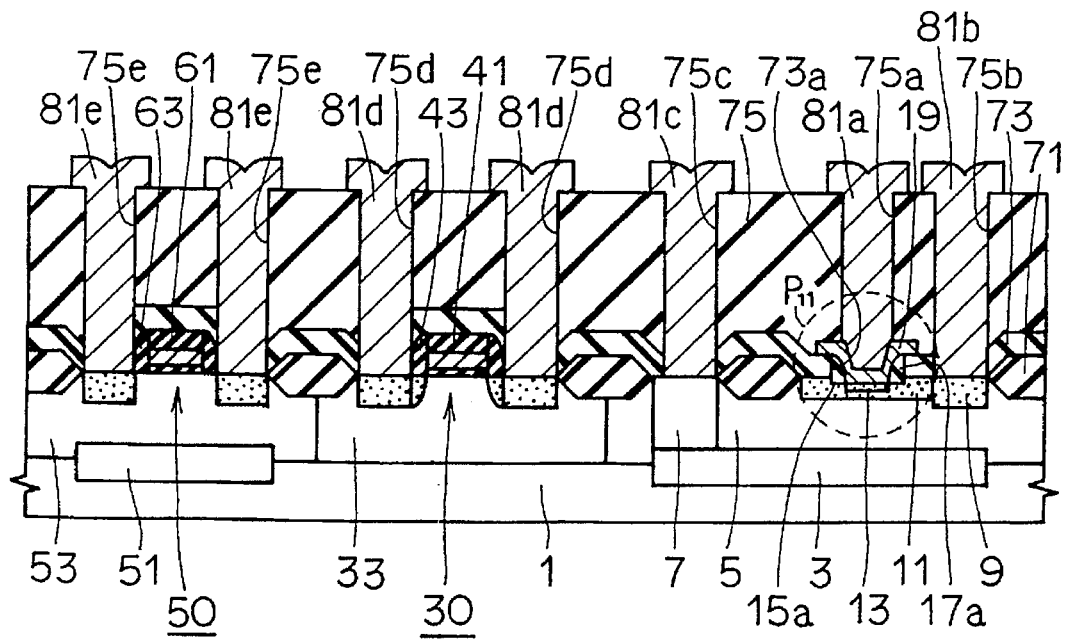

In order to eliminate the crystal defects at the surface of p⁻ base region 11, it also is possible to form a groove 15a shown in FIG. 11 by performing anisotropic etching to p⁻ base region 511 after the process shown in FIG. 48. In a structure of the semiconductor device of this case, a bottom surface of groove 15a makes an approximately right angle with a side surface thereof, as shown in FIG. 12.

The structure of the first embodiment (FIG. 1) in which a groove is formed by isotropic etching has the following advantages over the structure (FIG. 12) in which a groove is formed by anisotropic etching.

Figure 13:
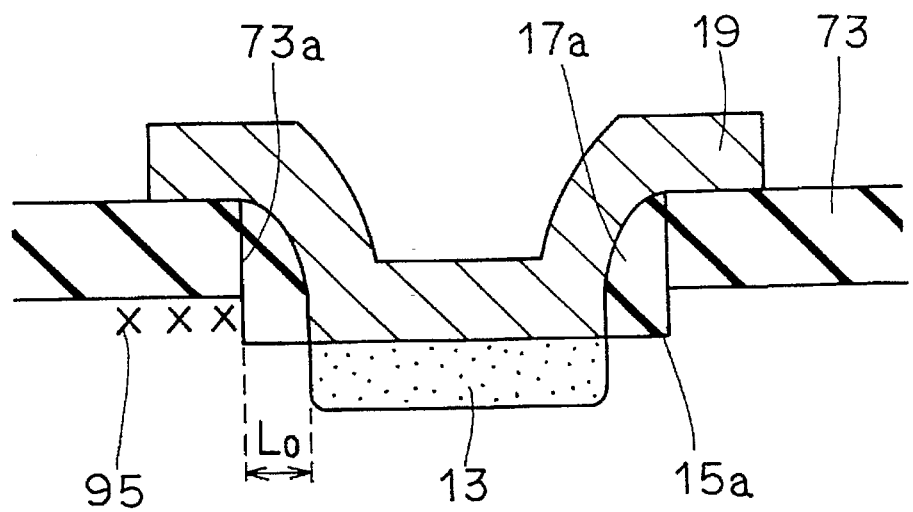
FIG. 13 is an enlarged schematic sectional view of a region $P_{11}$ shown in FIG. 12.
Figure 14:
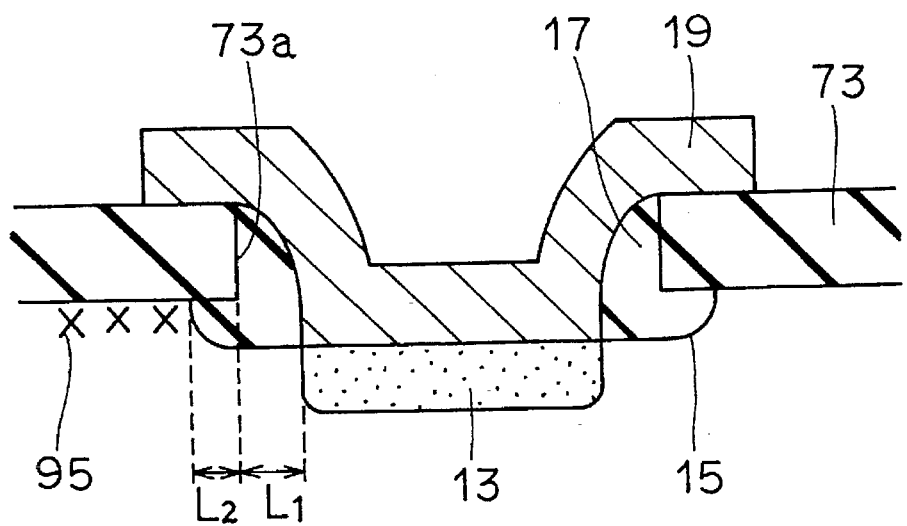
FIG. 14 is a schematic sectional view of distribution of crystal defects in the region $P_1$ shown in FIG. 1.

First, referring to FIG. 13, when groove 15a is formed by anisotropic etching, lateral dimension $L_0$ from the base-emitter junction up to a region where the crystal defects 95 are formed is relatively small. Therefore, there is great possibility that defects 95 are introduced into the depletion layer, if the depletion layer at the base-emitter junction extends at the time of operation of the bipolar transistor.

On the other hand, when groove 15 is formed by isotropic etching, groove 15 extends under first interlayer insulating layer 73. Thus, lateral dimension ($L_1+L_2$) from the base-emitter junction up to a region where defects 95 are distributed is relatively large. That is, the dimension $L_1+L_2$ of groove 15 is larger than the dimension $L_0$ of groove 15a in FIG. 13 by dimension $L_2$ of the portion which extends under first interlayer insulating layer 73. Thus, chance that defects 95 are introduced into the depletion layer is reduced even if the depletion layer at the base-emitter junction is extended at the time of operation of the bipolar transistor. Accordingly, generation of the leak current resulting from the distribution of crystal defects 95 in the depletion layer can further be suppressed.

Isotropic etching using $NF_3$ gas in processes shown in FIGS. 48 and 3 is chemical etching by fluorine (F) radicals in plasma. Since chemical reaction is used in this etching, damage to an etched surface can be made small compared to the physical implantation such as ion implantation. Thus, few crystal defects are introduced into a surface of $p^-$ base region 11 when this isotropic etching is performed.

Wet etching is essentially preferred-as the above-described isotropic etching in order to reduce damage to an etched surface. However, the wet etching is poor in controllability of etching. Thus, the above-described isotropic dry etching using $NF_3$ gas is used here instead of wet etching.

Embodiment 2

Figure 15:
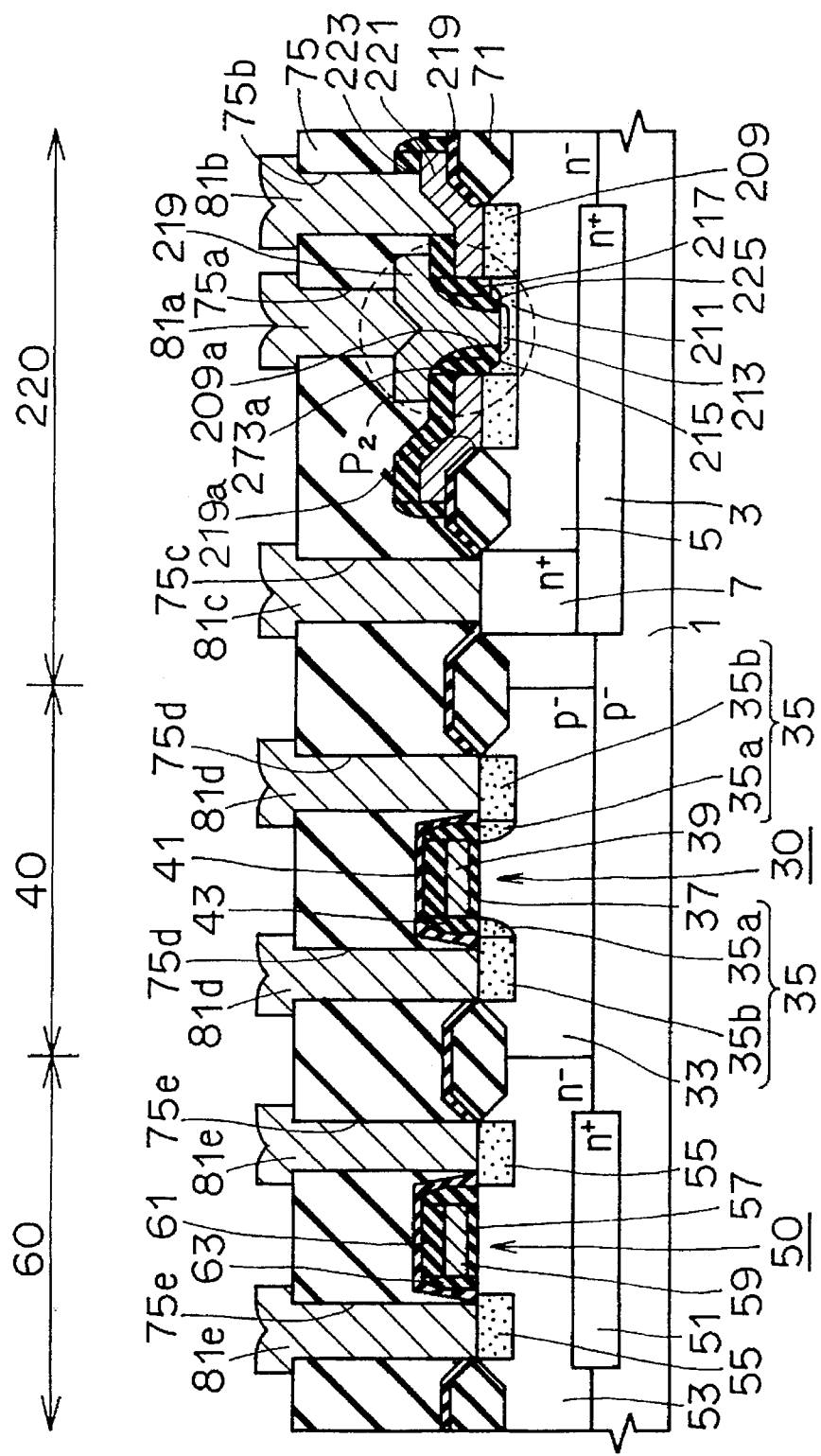
FIG. 15 is a schematic sectional view of a structure of a semiconductor device in accordance with a second embodiment of the present invention.
Figure 16:
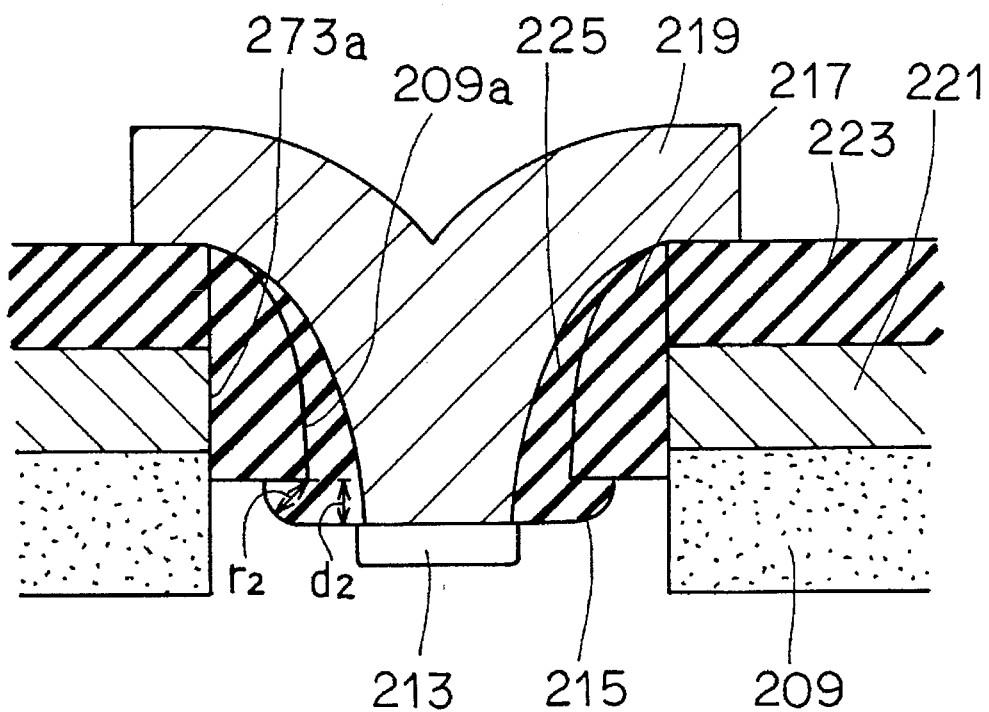
FIG. 16 is an enlarged schematic sectional view of a region $P_2$ shown in FIG. 15.

Referring to FIGS. 15 and 16, a semiconductor device in accordance with a second embodiment is different from the first embodiment particularly in a structure of a bipolar transistor region. A bipolar transistor region 220 of the second embodiment has a so-called double polycrystalline silicon-type bipolar transistor.

In bipolar transistor region 220, an $n^+$ buried layer 3 is formed at a surface of a $p^-$ silicon substrate 1 into which impurities has been introduced. An n-type impurity is introduced into $n^+$ buried layer 3 at a concentration of about $10^{20}$ $cm^{-3}$. An $n^+$ epitaxial growth layer 5 and an $n^+$ diffused layer 7 for extracting a collector are formed on a surface of $n^+$ buried layer 3. An n-type impurity is introduced into $n^-$ epitaxial growth layer 5 and $n^+$ diffused layer 7 at concentrations of about $10^{16}$ $cm^{-3}$ and $10^{20}$ $cm^{-3}$, respectively.

A $p^-$ base region 211 and a $p^+$ external base region 209 are formed at a surface of $n^+$ epitaxial growth layer 5 so as to be adjacent to each other. The $p^-$ base region 211 is formed with a junction depth of about 0.1 to about 0.3 μm from the surface of $n^-$ epitaxial growth layer 5. A p-type impurity is introduced into $p^+$ external base region 209 and $p^-$ base region 211 at concentrations of about $10^{20}$ $cm^{-3}$ and $10^{18}$ $cm^{-3}$, respectively.

A silicon oxide film 219 is formed to a thickness of about 300 Å over bipolar transistor region 220. A hole 219a reaching $p^+$ external base region 209 and $p^-$ base region 211 is formed in silicon oxide film 219. An electrode 221 for extracting an external base having a thickness of about 2000 Å is formed so as to come into contact with $p^+$ external base region 209 through hole 219a. Electrode for extracting an external base 211 is formed of doped polycrystalline silicon into which $BF_2$ ha been implanted.

A silicon oxide film 223 having a thickness of about 2000 Å is formed on electrode 221 for extracting an external base. First sidewall insulating layers 217 are formed, for example, of a silicon oxide film or a silicon nitride film so as to cover the side surfaces of electrode 221 for extracting an external base.

Referring mainly to FIG. 16, a groove 215 is formed so as to be located under an opening 209a at first sidewall insulating layer 217 and to extend under first sidewall insulating layer 217. Groove 215 has a depth $d_2$ of about 360 Å. A sidewall of groove 215 has such a shape that has radius of curvature $r_2$ substantially the same as the depth $d_2$ of groove 215. Accordingly, the radius of curvature $r_2$ is 360 Å.

Sidewall insulating layers 225 are formed, for example, of a silicon oxide film or a silicon nitride film so as to come into contact with sidewalls and bottom surfaces of first sidewall insulating layers 217. An $n^+$ emitter region 213 is formed at a bottom of groove 215 within $p^-$ base region 211. An n-type impurity is introduced into $n^+$ emitter region 213 at a concentration of about $10^{20}$ $cm^{-3}$.

An emitter electrode 219 is formed on second sidewall insulating layers 225 and silicon oxide film 223 so as to come into contact with $n^+$ emitter region 213. Emitter electrode 219 is formed of a doped polycrystalline silicon film into which arsenic has been introduced.

An interlayer insulating layer 75 is formed so as to cover emitter electrode 219. A contact hole 75a reaching emitter electrode 219 is formed in interlayer insulating layer 75. An aluminum interconnection layer 81a is formed so as to come into contact with emitter electrode 219 through contact hole 75a.

A contact hole 75b reaching electrode for extracting an external base 211 is formed in interlayer insulating layer 75 and insulating layer 223. An aluminum interconnection layer 81b is formed so as to come into contact with electrode 221 for extracting an external base through contact hole 75b.

A contact hole 75c reaching $n^+$ diffused layer 7 is formed in interlayer insulating layer 75 and insulating layer 219. An aluminum interconnection layer 81c is formed so as to come into contact with $n^+$ diffused layer 7 through contact hole 75c.

An nMOS transistor region 40 and a pMOS transistor region 60 are different from those of the first embodiment in a structure of an insulating layer. That is, in the first embodiment, first and second interlayer insulating layers 73 and 75 cover a surface as shown in FIG. 1, while, in the second embodiment, insulating layer 219 and interlayer insulating layer 75 cover nMOS transistor 30 and pMOS transistor 50.

Since, except for that, structure is similar to that of the first embodiment, description thereof will not be repeated.

A manufacturing method of the second embodiment will now be described.

The manufacturing method of the second embodiment first includes the steps of FIGS. 35–44.

Figure 17:
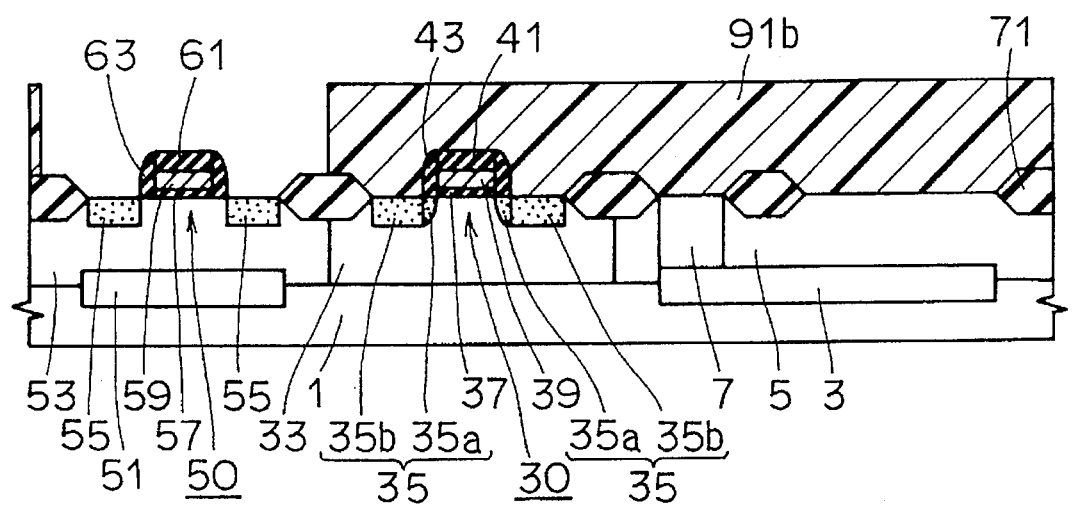
FIGS. 17–28 are schematic sectional views showing in order a manufacturing method of the semiconductor device in accordance with the second embodiment of the present invention.

Then, referring to FIG. 17, a photoresist is applied to a whole surface, and then exposed and developed. Thus, a resist pattern 91b which exposes the pMOS transistor region is formed. $BF_2$, for example, is implanted at a dose of $1.0\times10^{15}$ to $5.0\times10^{15}$ $cm^{-2}$ with 50 keV using resist pattern 91b as a mask. Thus, a pair of $p^+$ source/drain regions 55 are formed at a surface of an n⁻ well region 53. The pair of p⁺ source/drain regions 55, a gate oxide film 57 and a gate electrode 59 form a pMOS transistor 50. Resist pattern 91b is then removed.

Figure 18:
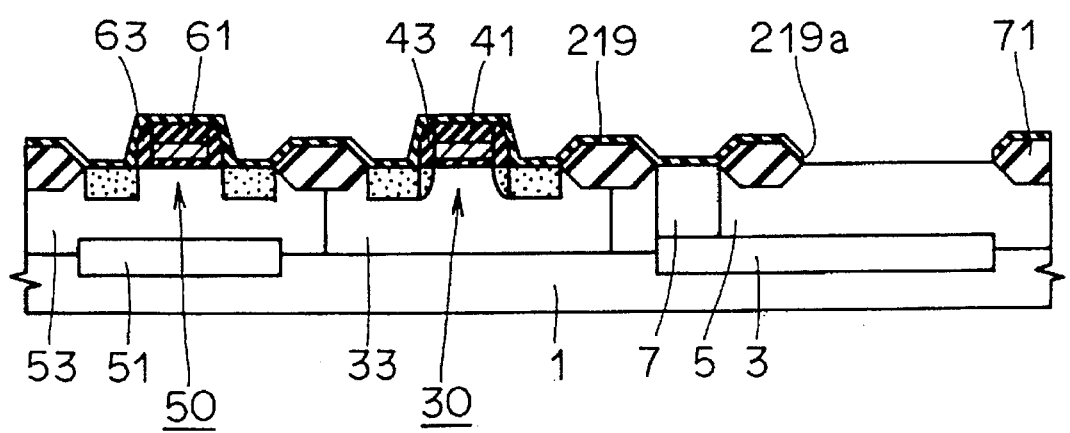

Referring to FIG. 18, an insulating film 219 made of, for example, a silicon oxide film is formed with a thickness of about 300 Å on the whole surface by LPCVD. An opening 219a is formed at a prescribed region of insulating film 219 by, for example, RIE. A portion of a surface of n⁻ epitaxial growth layer 5 is exposed by opening 219a.

Figure 19:
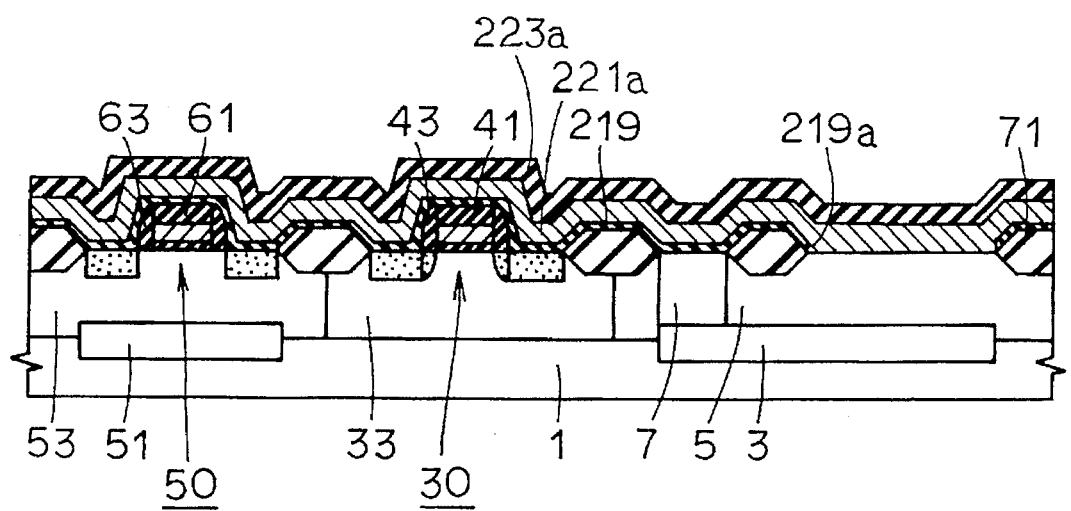

Referring to FIG. 19, a polycrystalline silicon film 221a having a thickness of about 2000 Å is formed on the whole surface by LPCVD. $BF_2$, for example, is implanted into the whole surface of polycrystalline silicon film 221a at a dose of about $4.0 \times 10^{15}$ cm⁻² with about 40 keV. An insulating film 223a made, for example, of a silicon oxide film is formed to a thickness of about 2000 Å on the whole surface of doped polycrystalline silicon film 221a. Then, insulating film 223a and doped polycrystalline silicon film 221a are patterned by photolithography and etching.

Figure 20:
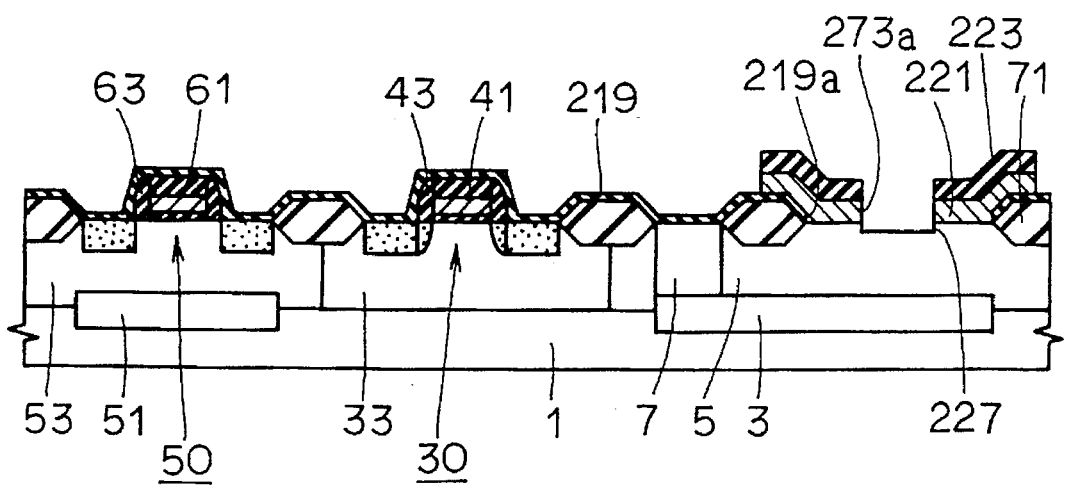

Referring to FIG. 20, by this patterning, an electrode 221 for extracting an external base is formed so as to come into contact with a portion of a surface of n⁻ epitaxial growth layer 5 through opening 219a. An insulating layer 223 is formed on electrode for extracting an external base 221. By this etching, a portion of the surface of n⁻ epitaxial growth layer 5 is etched by about 300 Å and a groove 227 is formed.

Figure 21:
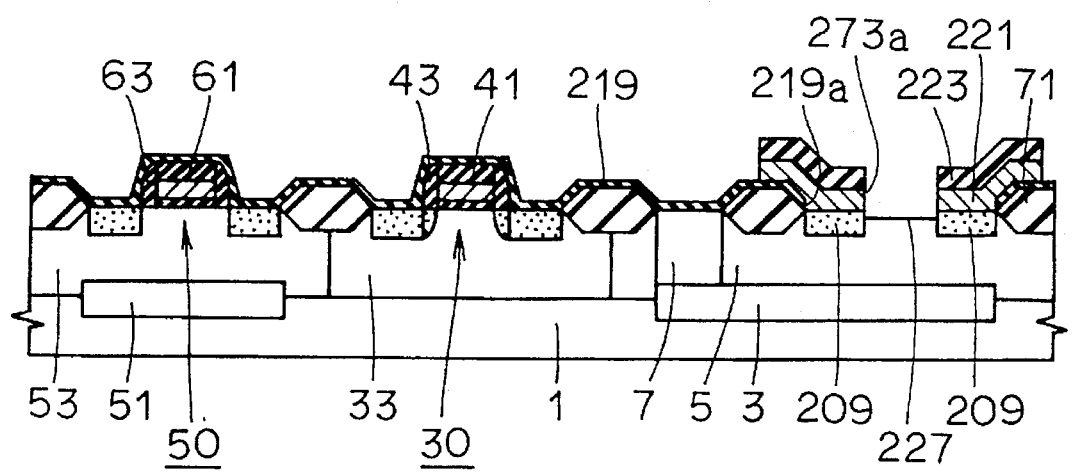

Referring to FIG. 21, thermal processing is performed, for example, at a temperature of about 800° C. for 30 minutes. Boron in electrode 221 for extracting an external base is diffused into n⁻ epitaxial growth layer 5 by this thermal processing. Thus, p⁺ external base regions 209 are formed at regions, which are in contact with electrode 221 for extracting an external base, of a surface of n⁻ epitaxial growth layer 5.

Figure 22:
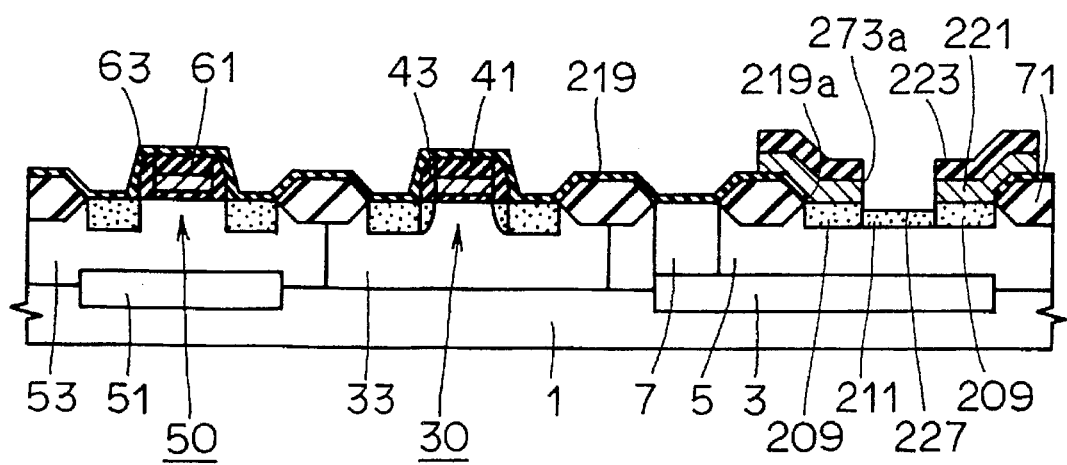

Referring to FIG. 22, $BF_2$, for example, is implanted at a dose of about $1.0 \times 10^{14}$ cm⁻² with about 40 keV. Then, thermal processing is performed, for example, at a temperature of about 800° C. for 30 minutes. A p⁻ base region 211 is formed at the bottom of groove 227 so as to be adjacent to p⁺ external base region 209 by this ion implantation and thermal processing. P⁻ base region 211 has a junction depth of about 0.1 to about 0.3 μm from the surface of groove 227.

Figure 23:
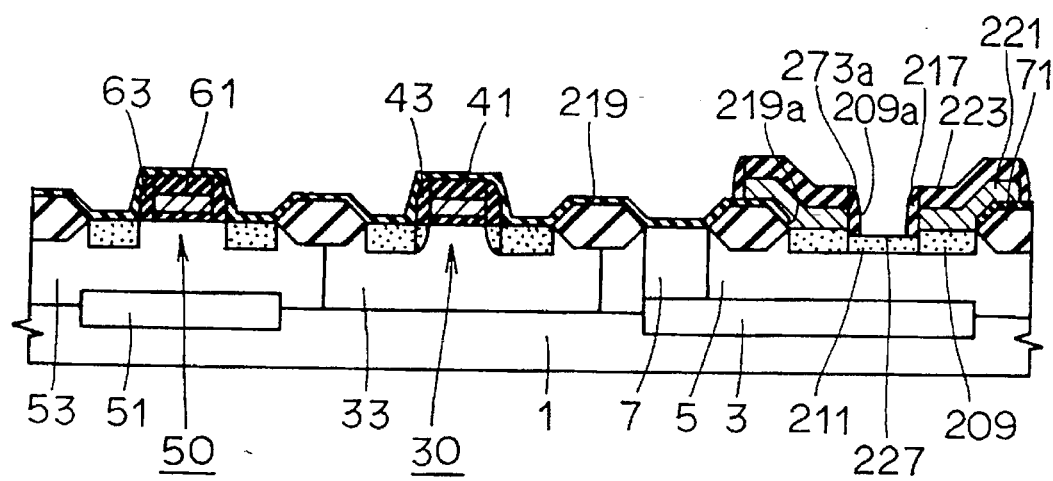

Referring to FIG. 23, after the insulating layer is formed on the whole surface, anisotropic etching is performed on the whole surface of the insulating layer. Thus, first sidewall insulating layers 217 are formed so as to cover the sidewalls of electrode for extracting an external base 221. A portion of the surface of p⁻ base region 211 is exposed from opening 209a the shape of which is defined by first sidewall insulating layers 217.

Figure 24:
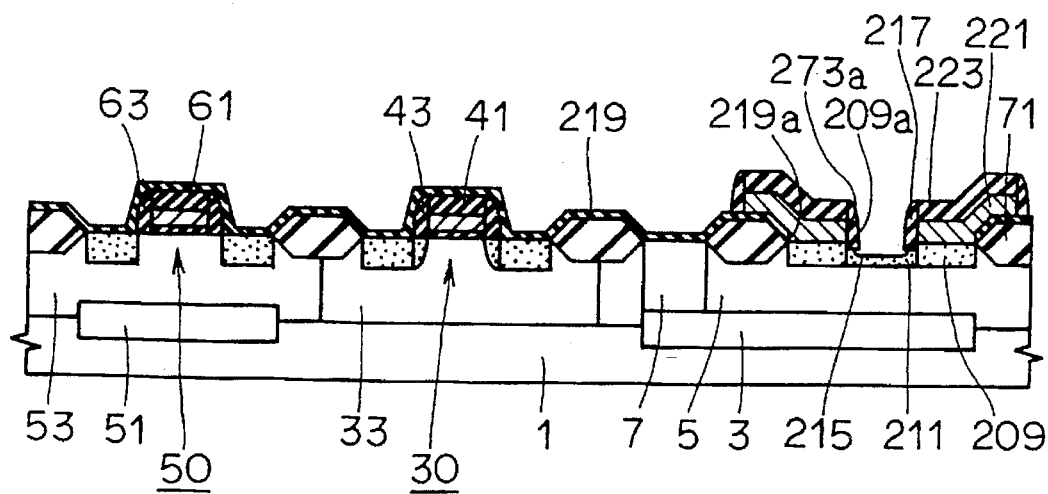

Referring to FIG. 24, isotropic etching is performed to p⁻ base region 211 using insulating films 219, 223 and first sidewall insulating layers 217 as a mask.

This isotropic etching is performed using gas prepared, for example, by mixing $NF_3$ and He with the partial pressures of 5 sccm and 200 sccm, respectively, with gas pressure in the chamber being set to 1 Torr and the power being set to 50 W. The etch rate of p⁻ base region 211 under such etching conditions is about 5 Å/sec.

The surface of p⁻ base region 211 is etched by about 360 Å by this isotropic dry etching. Since this etching is isotropic etching, groove 215 extends under first sidewall insulating layers 217.

Figure 25:
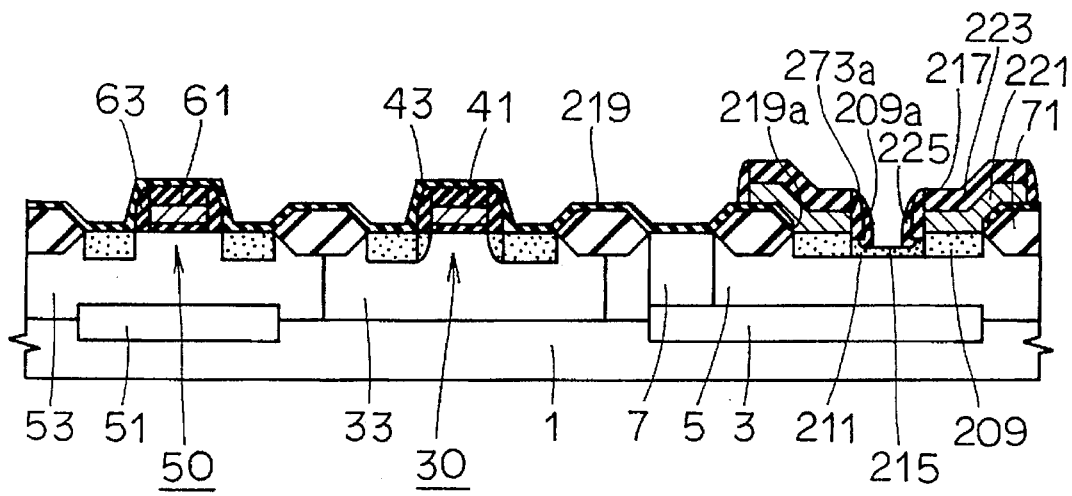

Referring to FIG. 25, after the insulating film is formed on the whole surface, anisotropic etching is performed to the whole surface of the insulating film. Thus, second sidewall insulating layers 225 are formed so as to cover sidewalls of first sidewall insulating layers 217 and to expose a portion of the surface of p⁻ base region 211.

Figure 26:
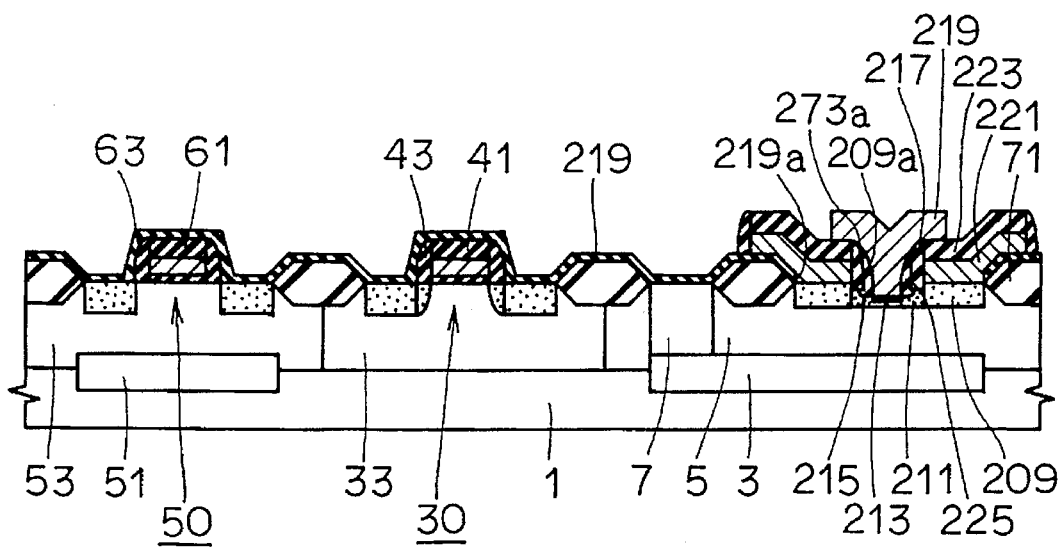

Referring to FIG. 26, a polycrystalline silicon film with a thickness of about 2000 Å is formed on the whole surface by, for example, LPCVD. Arsenic is implanted into the whole surface of the polycrystalline silicon film at a dose of about $5.0 \times 10^{15}$ cm⁻² with about 60 keV. Then, thermal processing is performed, for example, at a temperature of 800° to 850° C. for about 30 minutes. Thus, arsenic in the above-mentioned doped polycrystalline silicon film is diffused from the bottom surface of groove 215 into p⁻ base region 211. Thus, an n⁺ emitter region 213 is formed at the bottom surface of groove 215 within the p⁻ base region 211. Then, the above-mentioned doped polycrystalline silicon film 219 is patterned and an emitter electrode 219 which is in contact with n⁺ emitter region 213 is formed.

Figure 27:
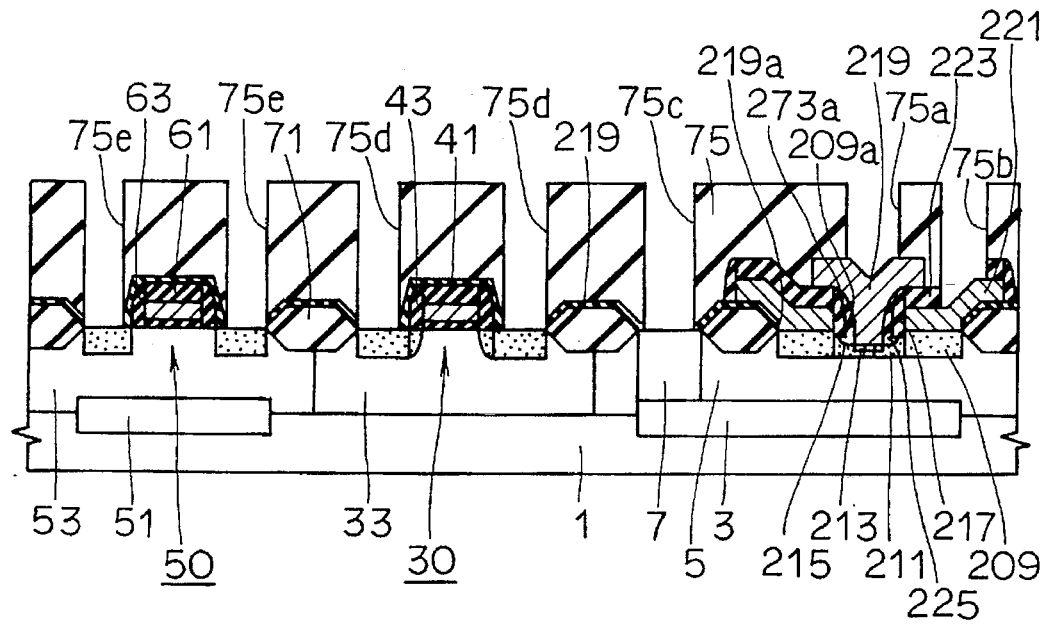

Referring to FIG. 27, an interlayer insulating layer 75 is formed on insulating layer 219 so as to cover emitter electrode 219. Contact holes 75a, 75b, 75c, 75d and 75e are formed in interlayer insulating layer 75 by photolithography and etching.

Figure 28:
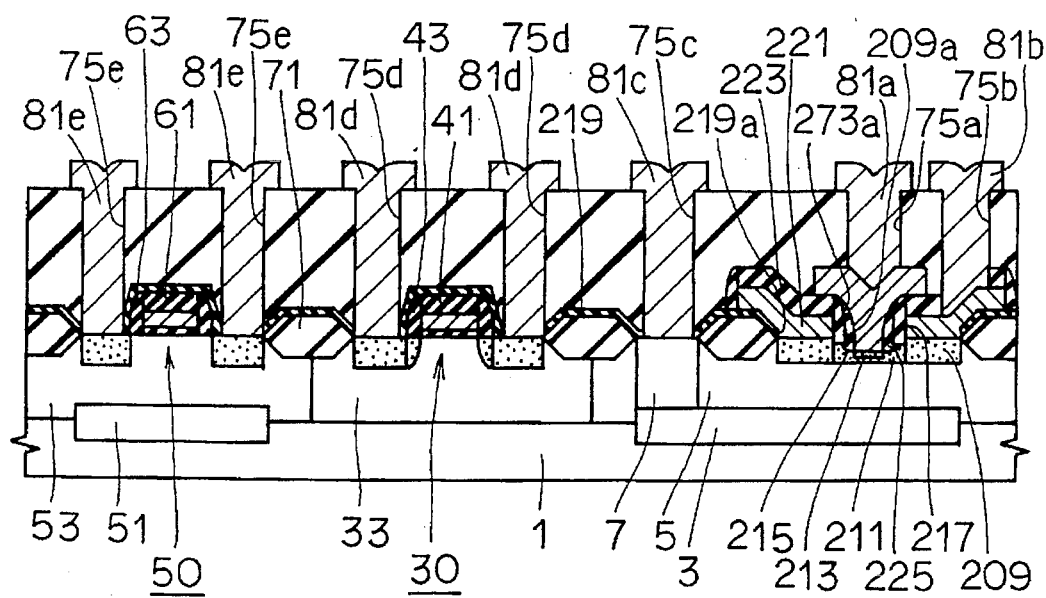

Referring to FIG. 28, aluminum interconnection layers 81a, 81b, 81c, 81d and 81e are formed so as to come into contact with conductive regions or the like of the lower layer through contact holes 75a, 75b, 75c, 75d and 75e, respectively.

In the second embodiment, a groove 215 is formed at the surface of p⁻ base region 211 as in the first embodiment. The n⁺ emitter region 213 is formed so as to come into contact with the bottom surface of groove 215. Thus, since the crystal defects are removed by groove 215 as in the first embodiment, generation of the leak current resulting from the distribution of the crystal defects at the base-emitter junction will be suppressed.

Groove 215 is formed by isotropic etching. Thus, groove 215 extends under first sidewall insulating layers 217. Accordingly, the crystal defects are extensively removed. Consequently, the crystal defects are prevented from being introduced into the depletion layer, even if the depletion layer at the base-emitter junction extends at the time of operation of the bipolar transistor. Thus, generation of the leak current resulting from the distribution of the crystal defects can further be suppressed.

Embodiment 3

Figure 29:
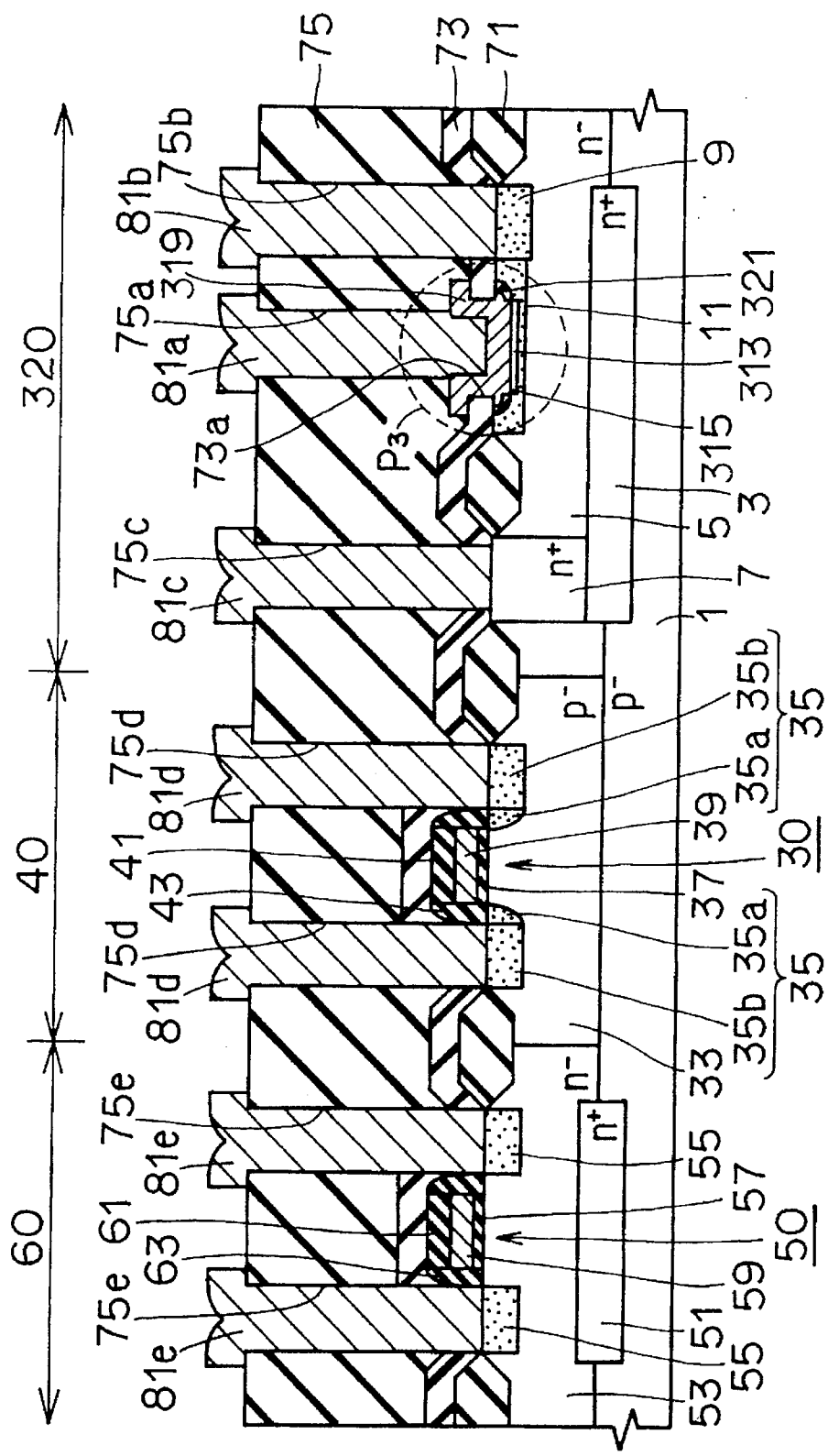
FIG. 29 is a schematic sectional view of a structure of a semiconductor device in accordance with a third embodiment of the present invention.
Figure 30:
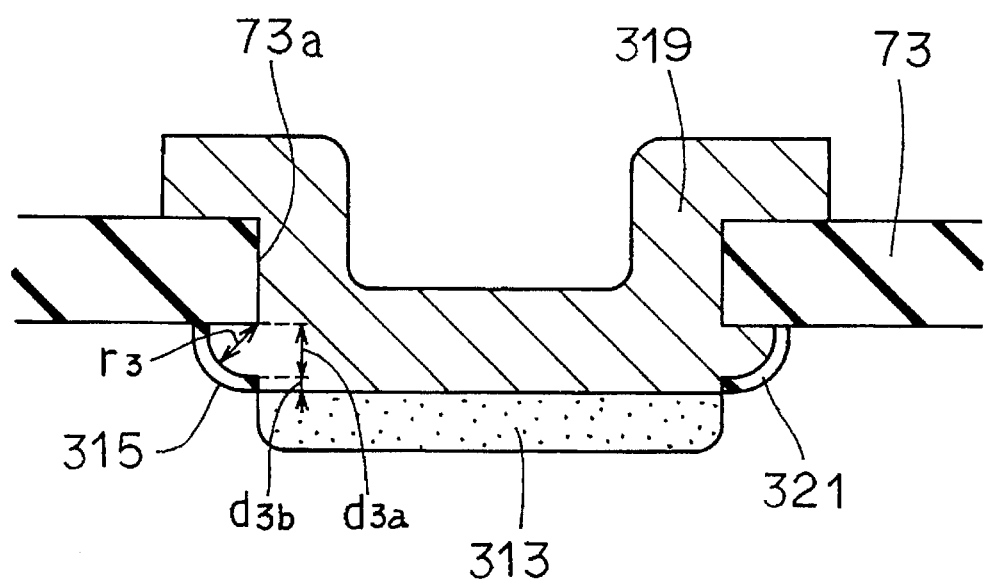
FIG. 30 is an enlarged schematic sectional view of a region $P_3$ shown in FIG. 29.

Referring to FIGS. 29 and 30, the structure of the semiconductor device of the third embodiment is different from that of the first embodiment in the structure of the bipolar transistor. Sidewall insulating layer 17 is provided in the first embodiment, while sidewall insulating layer 17 is not provided in the second embodiment. A silicon oxide film 321 which covers a sidewall of a groove 315 is formed instead.

More specifically, referring to FIG. 30, a groove 315 is formed so as to be located under an opening 73a and to extend under a first interlayer insulating layer 73. Groove 315 has a depth ($d_{3a}+d_{3b}$) of about 360 Å. A sidewall of groove 315 has such a shape that has a radius of curvature $r_3$ substantially the same as the depth ($d_{3a}+d_{3b}$) of the groove. Silicon oxide film 321 with a thickness of about 100 Å is formed only in a portion of a surface of groove 315, which is located under first interlayer insulating layer 73.

An n⁺ emitter region 313 is formed at a portion of the bottom surface of groove 315, which is not covered with silicon oxide film 321. An emitter electrode 319 is formed so as to come into contact with n⁺ emitter region 313 through opening 73a. Emitter electrode 319 is formed of doped polycrystalline silicon into which arsenic has been implanted.

Since other structure of the third embodiment is approximately the same as that of the first embodiment, description thereof will not be repeated.

A manufacturing method of a semiconductor device in accordance with the third embodiment will now be described.

The manufacturing method of the semiconductor device of the third embodiment includes the processes shown in FIGS. 35–48 and the process shown in FIG. 3 as initial processes.

Figure 31:
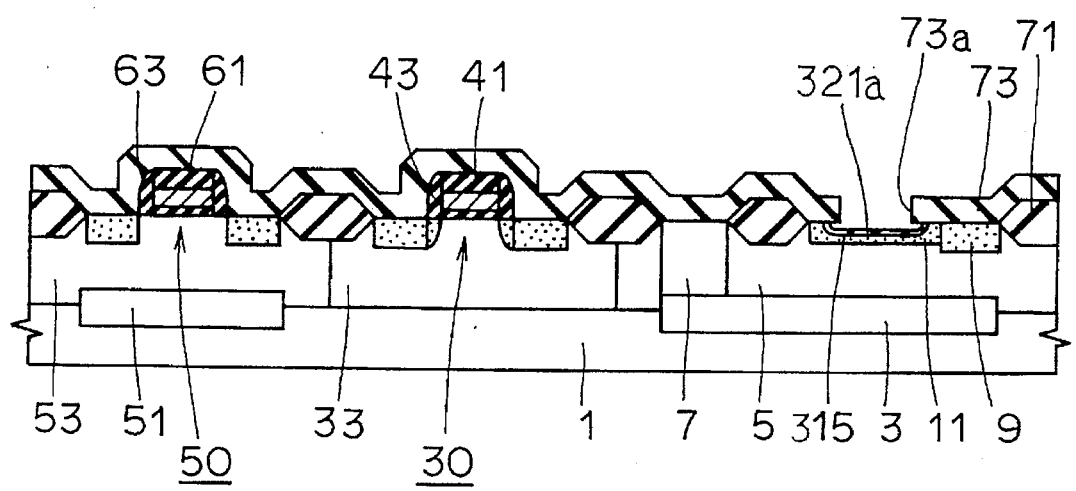
FIGS. 31–33 are schematic sectional views showing in order a manufacturing method of the semiconductor device in accordance with the third embodiment of the present invention.

Then, referring to FIG. 31, thermal oxidation is performed, for example, in an $O_2$ atmosphere. Thus, a silicon oxide film 321a with a thickness of about 100 Å is formed at a surface of groove 315 which is exposed from opening 73a. Then, anisotropic dry etching is performed to the whole surface.

Figure 32:
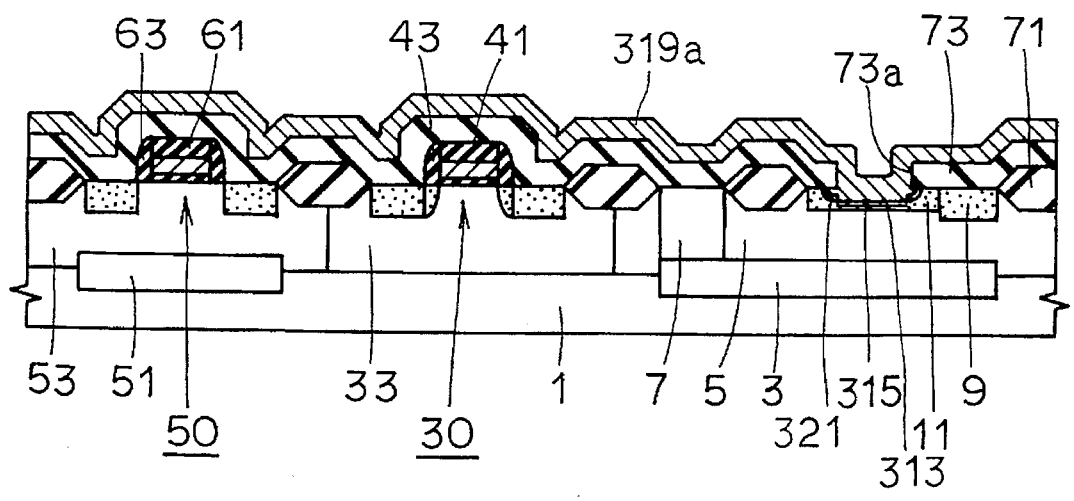
Figure 33:
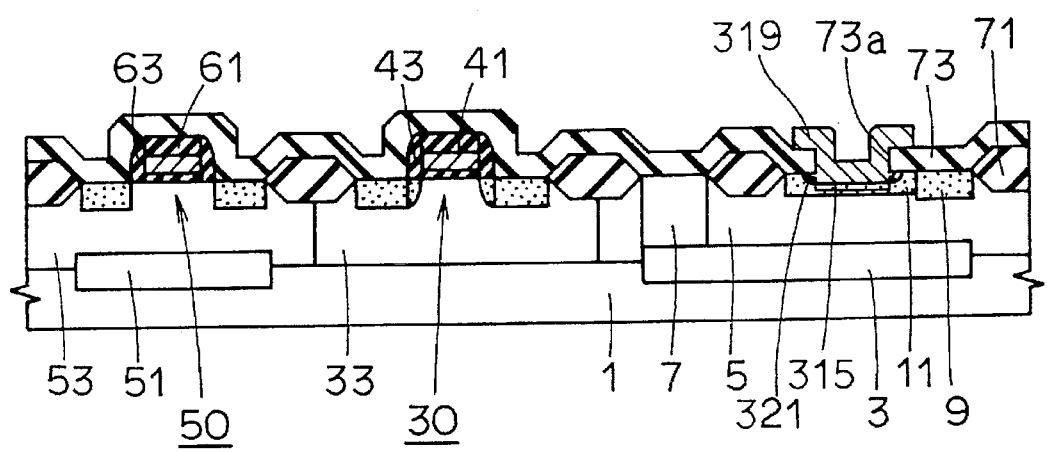
Figure 34:
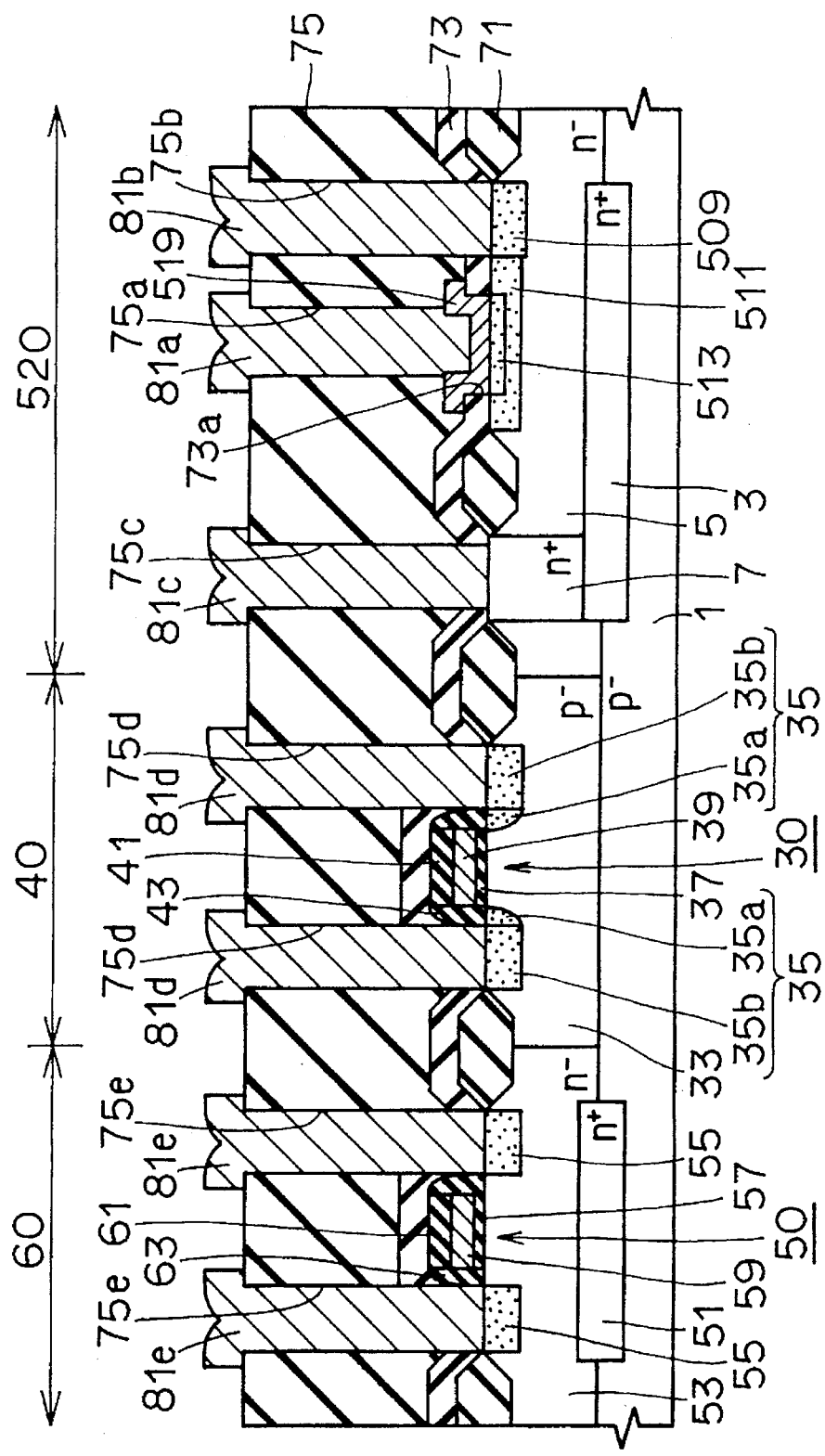
FIG. 34 is a schematic sectional view of a structure of a conventional semiconductor device.
Figure 35:
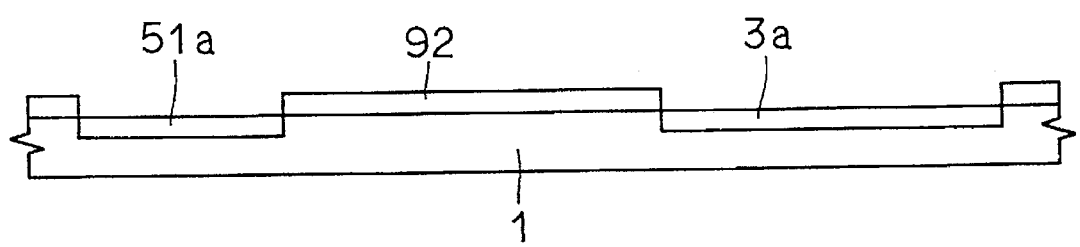
FIGS. 35–52 are schematic sectional views showing in order a manufacturing method of the conventional semiconductor device.
Figure 36:
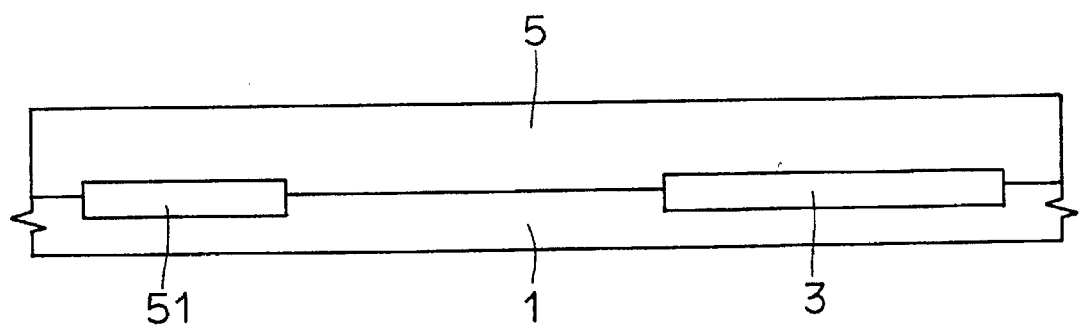
Figure 37:
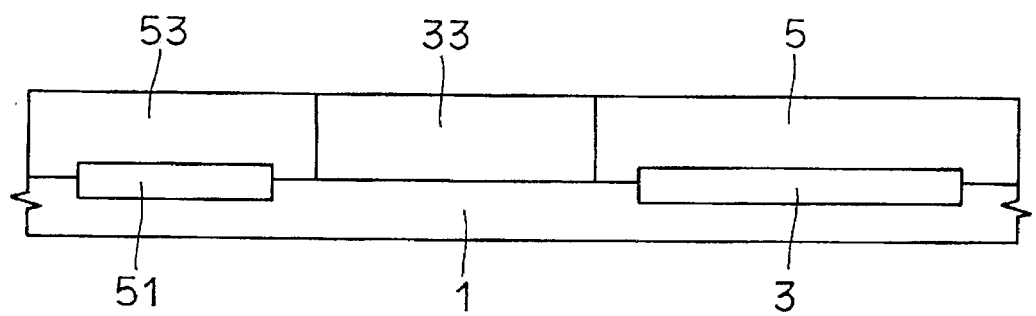
Figure 38:
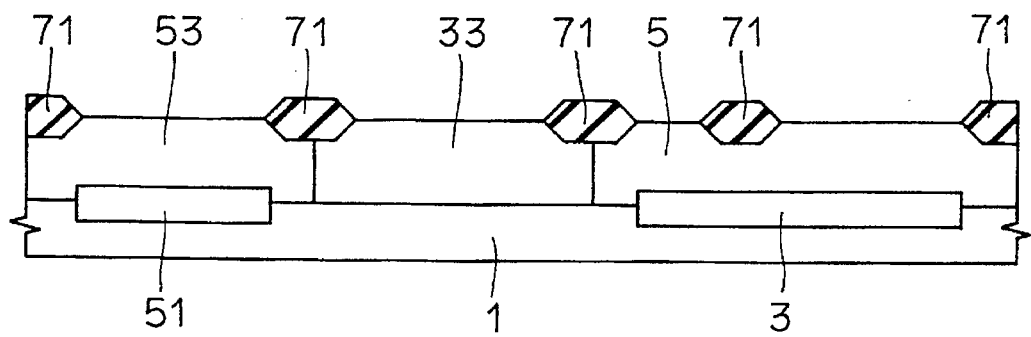
Figure 39:
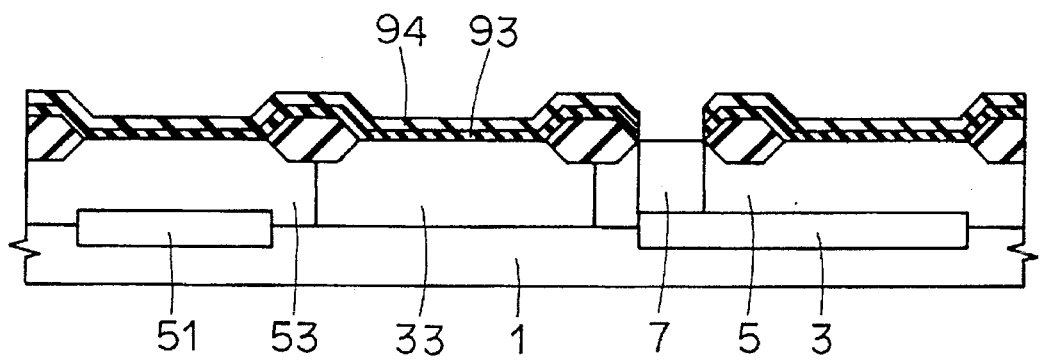
Figure 40:
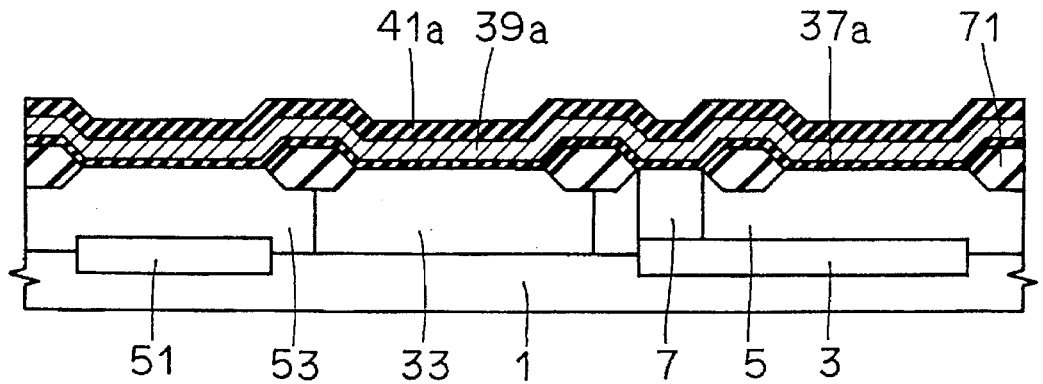
Figure 41:
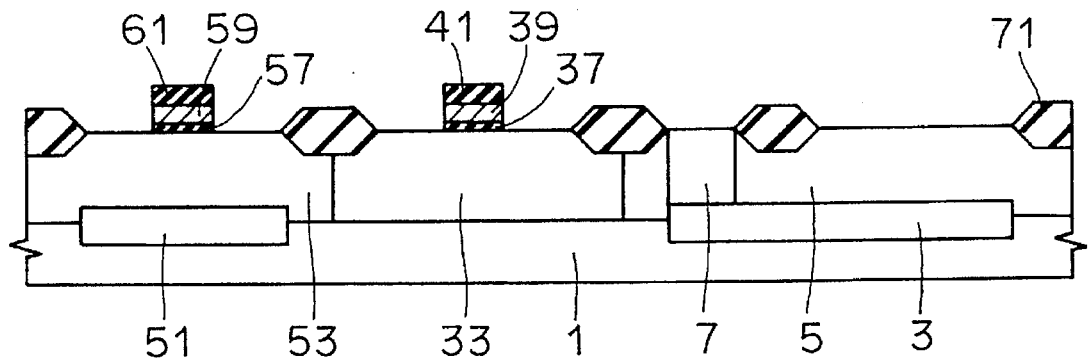
Figure 42:
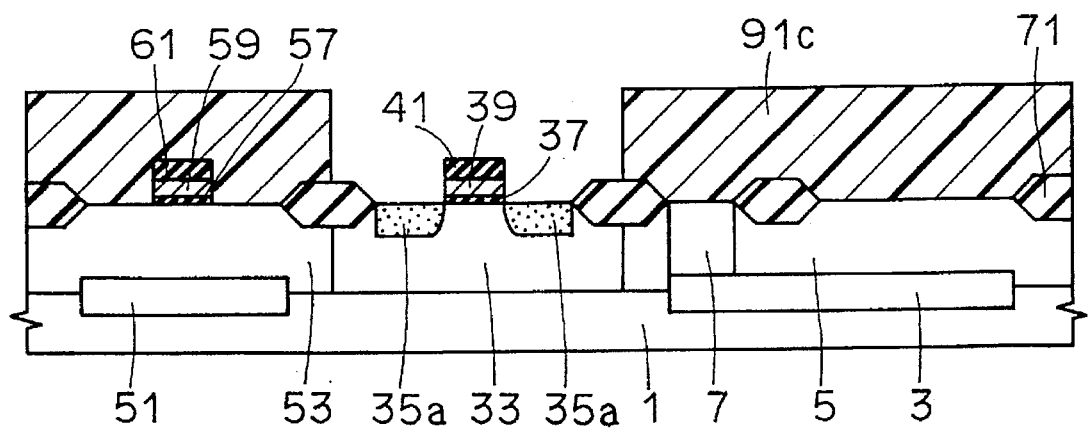
Figure 43:
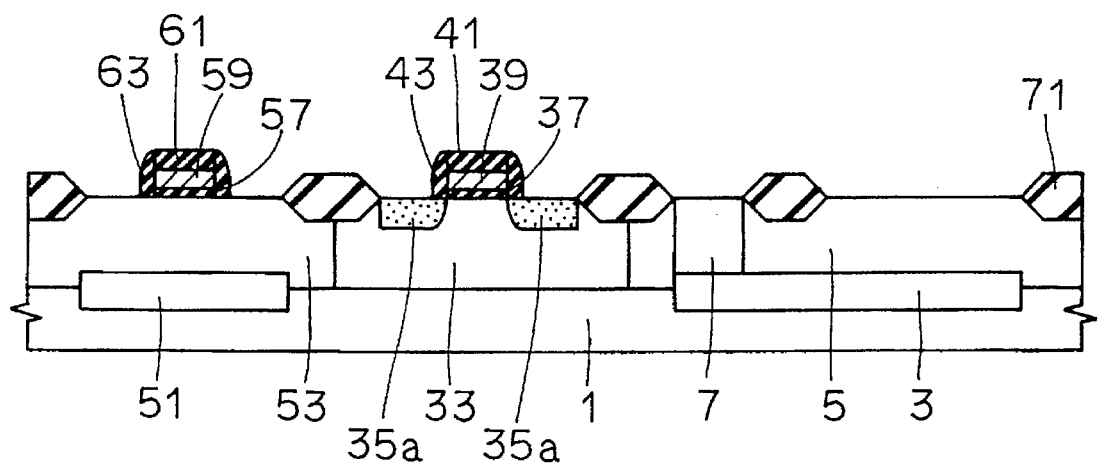
Figure 44:
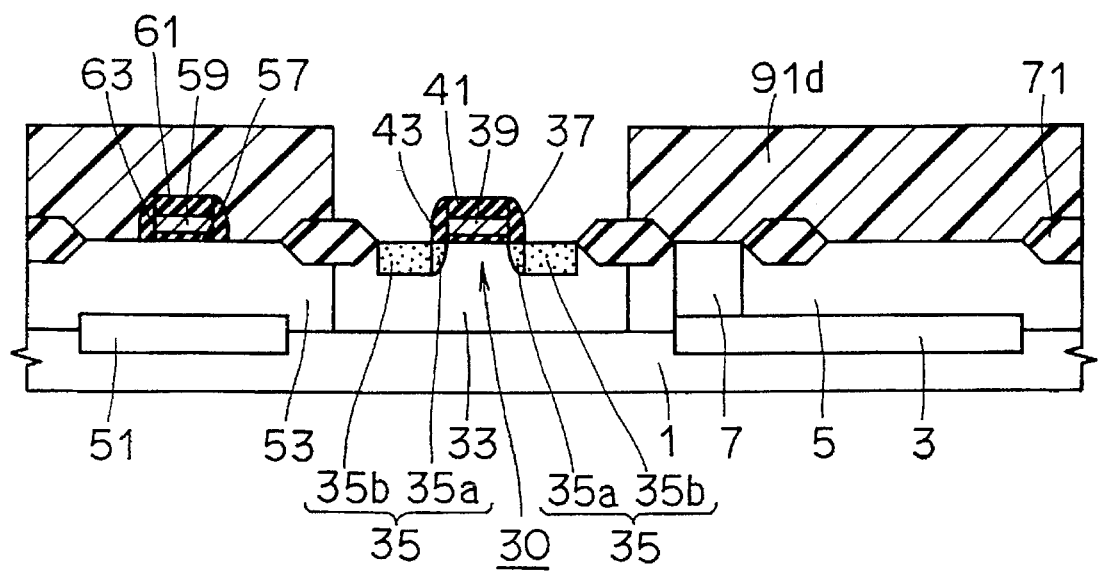
Figure 45:
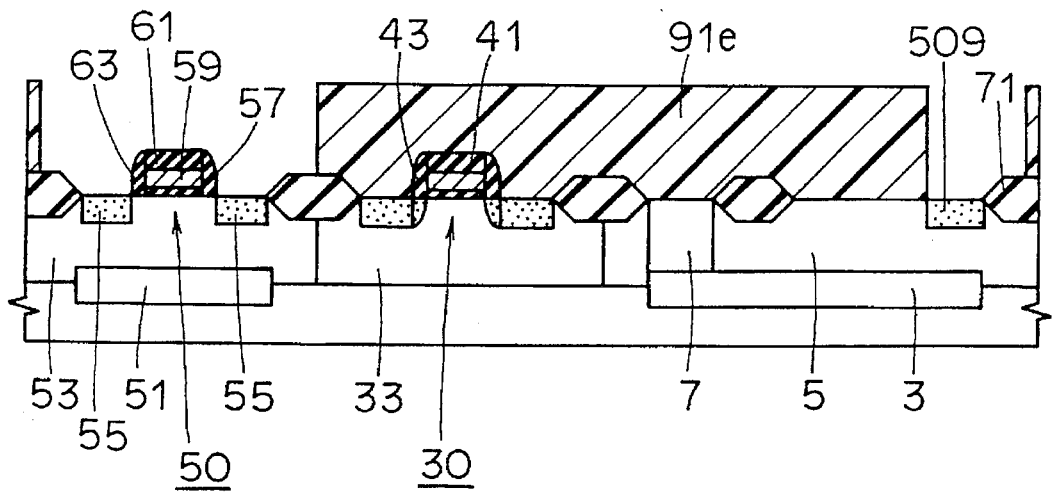

Referring to FIG. 32, as a result of this etching, silicon oxide film 321 is left only on the surface of groove 315, which is located under first interlayer insulating layer 73. Then, a polycrystalline silicon film 319a with a thickness of about 2000 Å is formed on the whole surface, for example, by LPCVD. Arsenic is implanted into the whole surface of polycrystalline silicon film 319a at a dose of about $5.0 \times 10^{15}$ $cm^{-2}$ with about 60 keV. Then, thermal processing is performed, for example, at a temperature of 800° to 850° C. for about 30 minutes. Thus, arsenic in doped polycrystalline silicon film 319a is diffused from the bottom surface of groove 315 within $p^-$ base region 11. An $n^+$ emitter region 313 is formed at the bottom surface of groove 315 within $p^-$ base region 11. Then, doped polycrystalline silicon film 319a is patterned by photolithography and etching and an emitter electrode 319 is formed as shown in FIG. 33.

Since the steps thereafter are approximately the same as those in the first embodiment, description thereof will be omitted.

In the third embodiment, groove 315 is formed at the surface of $p^-$ base region 11 as shown in FIGS. 29 and 30, as in the first embodiment. At a bottom surface of groove 315, $n^+$ emitter region 313 is formed. Since groove 315 is formed, the crystal defects produced at the time of ion implantation for formation of $p^-$ base region 11 are removed. Thus, generation of the leak current resulting from the fact that the crystal defects are introduced into the depletion layer at the base-emitter junction will be suppressed.

Since groove 315 is formed by isotropic etching, groove 315 extends under first interlayer insulating layer 73. The crystal defects are extensively removed by forming groove 315 in this way. Thus, the crystal defects are prevented from being introduced into the depletion layer even if the depletion layer at the base-emitter junction extends at the time of operation of the bipolar transistor. Consequently, generation of the leak current can further be suppressed.

In the semiconductor device of the present invention, chance that the crystal defects are distributed to the depletion layer at the base-emitter junction is reduced, since the groove is formed at the surface of the base impurity region. Accordingly, generation of the leak current resulting from distribution of the crystal defects in the depletion layer will be prevented.

In addition, since the groove extends not only under the opening provided in the insulating layer but also under the insulating layer, generation of the leak current can further be suppressed.

Since generation of the leak current can significantly be suppressed as described above, the bipolar transistor can be operated at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

a collector impurity region of a first conductivity type formed on the main surface of said semiconductor substrate;

a base impurity region of a second conductivity type formed on the main surface of said semiconductor substrate within said collector impurity region; and an insulating layer formed on said base impurity region and having a through opening; wherein a groove formed at the main surface of said semiconductor substrate within said base impurity region so as to be located under said through opening of the insulating layer extending the through opening to a region under a bottom surface of said insulating layer; said device further comprising an emitter impurity region of a first conductivity type formed at a bottom surface of said groove in said base impurity region and spaced laterally from an end of said groove; and a sidewall insulating layer covering a surface of said groove located under said insulating layer so as to expose a portion of a surface of said emitter impurity region.

2. The semiconductor device according to claim 1, wherein said sidewall insulating layer covers a wall surface of said insulating layer defining said through opening and is in contact with a bottom surface of said insulating layer.

3. The semiconductor device according to claim 1, wherein said sidewall insulating layer covers only a portion, which is located under said insulating layer, of a surface of said groove.

4. The semiconductor device according to claim 1, wherein an end portion of said groove positioned under said insulating layer has such a shape that has a radius of curvature which is substantially the same as a depth of said groove.

5. The semiconductor device according to claim 1, further comprising:

an emitter electrode layer formed so as to come into contact with a portion, which is exposed from said sidewall insulating layer, of a surface of said emitter impurity region.

6. The semiconductor device according to claim 1, wherein said base impurity region includes boron (B) and said emitter impurity region includes arsenic (As).

7. The semiconductor device according to claim 1, wherein an edge of the emitter impurity region is positioned within and laterally spaced apart from said wall surface defining said through opening in the insulating layer by a distance L1, the sidewall insulating layer extends from said wall surface defining said through opening in the groove on the bottom of the insulating layer a distance L2, and the edge of the emitter impurity region is laterally spaced apart from an end of the groove by a distance equal to L1+L2.

8. The semiconductor device according to claim 1, wherein an edge of the emitter impurity region is positioned within and laterally spaced from said wall surface defining said through opening.

* * * * *